US012744538B2

(12) United States Patent
Son et al.

(10) Patent No.: US 12,744,538 B2
(45) Date of Patent: Sep. 22, 2026

(54) PHASE INTERPOLATOR LINEARITY THROUGH ADJUSTMENTS TO UNIT CURRENT STEP

(71) Applicant: QUALCOMM Incorporated, San Diego, CA (US)

(72) Inventors: Seuk Son, San Diego, CA (US); Ying Duan, San Diego, CA (US); Qinqing Cao, San Diego, CA (US); Abhay Dixit, San Diego, CA (US)

(73) Assignee: QUALCOMM Incorproated, San Diego, CA (US)

( * ) Notice: Subject to any disclaimer, the term of this patent is extended or adjusted under 35 U.S.C. 154(b) by 83 days.

(21) Appl. No.: 18/913,931

(22) Filed: Oct. 11, 2024

(65) Prior Publication Data

US 2026/0106622 A1 Apr. 16, 2026

(51) Int. Cl.
*H03L 7/099* (2006.01)
*H03L 7/081* (2006.01)

(52) U.S. Cl.
CPC .......... *H03L 7/0998* (2013.01); *H03L 7/0814* (2013.01)

(58) Field of Classification Search
CPC .......... H03K 2005/00065; H03K 2005/00052; H03K 5/135; H03K 2005/00286; H04L 7/0025; H03L 7/0998; H03L 7/0814; H03L 7/081
See application file for complete search history.

(56) References Cited

U.S. PATENT DOCUMENTS 7,394,325 B2 * 7/2008 Ueno .................. H03K 3/0322 331/57
7,423,469 B2 * 9/2008 Pickering ................ H03K 5/13 327/256
8,184,029 B1 * 5/2012 Hsieh .................. H03K 19/177 327/231
9,503,252 B2 * 11/2016 Huang .................. H04L 7/0025
10,498,231 B2 * 12/2019 Mikhael .................. H02M 3/07
2013/0049831 A1 * 2/2013 Nedachi ................. H03K 5/135 327/158
2015/0358008 A1 * 12/2015 Sun .......................... H03K 5/13 327/231
2018/0097512 A1 * 4/2018 Manian .................... H03K 5/26
2018/0131378 A1 5/2018 Haroun et al.
2020/0007137 A1 * 1/2020 Van Ierssel ............. H03M 1/06

OTHER PUBLICATIONS

Mishra A.K., et al., "Improving Linearity in CMOS Phase Interpolators", IEEE Journal of Solid-State Circuits, vol. 58, No. 6, Jun. 2023, pp. 1623-1635.

* cited by examiner

*Primary Examiner* — Sophia Vlahos
(74) *Attorney, Agent, or Firm* — Loza & Loza, LLP

(57) ABSTRACT

A phase interpolator includes a plurality of source-coupled transistor pairs and a plurality of current sources. The plurality of source-coupled transistor pairs may be configured to receive different phase shifted versions of an input signal. A differential output of each source-coupled transistor pair may be coupled to a differential output of the phase interpolator. Each current source in the plurality of current sources may be configured to supply a portion of a tail current to one or more source-coupled transistor pairs in the plurality of source-coupled transistor pairs at a level defined by a codeword. Step changes in amplitude of the tail current may occur in response to incremental changes in the codeword. The step changes in amplitude may vary with the amplitude of the tail current.

17 Claims, 10 Drawing Sheets

102

SoC

104 Central Processing Unit (CPU)

106 Modem Processor

108 Graphics Processor (GPU)

110 Application Processor

120 Interconnection/Bus Module

USB Controller 112

Memory Controller 114

Centralized Resource Manager (CRM) 116

System Components and Resources 118

126 Memory Interface/Bus

124 Memory

Ideal Phase Interpolator Operation

| Current Source Configuration Table |
| --- |
| Tuning Code: 0-3: Current step = I * 2/3 |
| Tuning Code: 4-11: Current step = I |
| Tuning Code: 12-19: Current step = I * 4/3 |
| Tuning Code: 20-27: Current step = I |
| Tuning Code: 28-32: Current step = I * 2/3 |

PHASE INTERPOLATOR LINEARITY THROUGH ADJUSTMENTS TO UNIT CURRENT STEP

TECHNICAL FIELD

The present disclosure generally relates to high-speed data communication interfaces and, more particularly, to linearizing the operation of phase interpolators that include current-mode logic.

BACKGROUND

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever.

Many devices, including wireless communication devices, typically include high-speed communication links for communication of signals between hardware components. The high-speed communication links may be operated in accordance with proprietary or standards-defined protocols. The phase relationship between data signals and clock signals may be controlled using phase interpolators. Many high-speed communication links employ integrating-mode phase interpolators, in which output signals are generated through the integration of phase-shifted weighted current sources. High-speed phase integrating-mode interpolators can suffer from non-linearity at higher clock frequencies and there is a need to improve linearity of such phase interpolators.

SUMMARY

Certain aspects of the disclosure relate to systems, apparatus, methods and techniques for linearizing the operation of phase interpolators in a high-frequency interface. In one example, the high-frequency interface includes a serializer/deserializer used for communication over high data rate communication links. Linearity can be improved for operating conditions that are subject to variation due to changes in process parameters, voltage and/or temperature.

In various aspects of the disclosure, a phase interpolator includes a plurality of source-coupled transistor pairs and a plurality of current sources. The plurality of source-coupled transistor pairs may be configured to receive different phase shifted versions of an input signal. A differential output of each source-coupled transistor pair may be coupled to a differential output of the phase interpolator. Each current source in the plurality of current sources may be configured to supply a portion of a tail current to one or more source-coupled transistor pairs in the plurality of source-coupled transistor pairs at a level defined by a codeword. Step changes in amplitude of the tail current may occur in response to incremental changes in the codeword. The step changes in amplitude may vary with the amplitude of the tail current.

In various aspects of the disclosure, an apparatus includes means for driving a differential output of a phase interpolator and means for supplying a tail current to one or more source-coupled transistor pairs in the plurality of source-coupled transistor pairs. The means for driving the differential output of the phase interpolator may include a plurality of source-coupled transistor pairs configured to receive different phase shifted versions of an input signal. Each source-coupled transistor pair may be coupled to the differential output of a phase interpolator. The means for supplying the tail current to the one or more source-coupled transistor pairs in the plurality of source-coupled transistor pairs may include a plurality of current sources. Each current source may be configured to supply a portion of the tail current at a level defined by a codeword. The codeword may be configured based on total tail current supplied to the one or more source-coupled transistor pairs. Step changes in amplitude of the tail current may occur in response to incremental changes in the codeword. The step changes in amplitude may vary with the amplitude of the tail current.

In various aspects of the disclosure, a method for operating a phase interpolator includes receiving different phase shifted versions of an input signal at a plurality of source-coupled transistor pairs, and configuring a current source to supply a portion of a tail current to one or more source-coupled transistor pairs in the plurality of source-coupled transistor pairs at a level defined by a codeword that is configured based on total tail current supplied to the one or more source-coupled transistor pairs. A differential output of each source-coupled transistor pair may be coupled to a differential output of the phase interpolator. The current source may be one of a plurality of current sources. Step changes in amplitude of the tail current may occur in response to incremental changes in the codeword. The step changes in amplitude may vary with the amplitude of the tail current.

In certain aspects, the amplitude of the tail current is the sum of currents supplied by a subset of the plurality of current sources that is enabled by the codeword. In one aspect, a value encoded in the codeword selects a subset of the plurality of current sources that is coupled to the one or more source-coupled transistor pairs in the plurality of source-coupled transistor pairs.

In certain aspects, amplitude of step changes in the tail current corresponds to a unit current level when the value encoded in the codeword lies within a first range of values. Amplitude of step changes in the tail current may be decreased from the unit current level by a first fraction of the unit current level when the value encoded in the codeword lies within a second range of values. Amplitude of step changes in the tail current may be increased by a second fraction of the unit current level when the value encoded in the codeword lies within a third range of values. In one aspect, amplitude of step changes in the tail current is defined by a lookup table that is indexed by the codeword.

In one aspect, the phase interpolator has a plurality of tail current subcircuits. Each tail current subcircuit may include one of the plurality of current sources and a plurality of switches. The current source in each tail current subcircuit may be coupled to the one or more source-coupled transistor pairs when enabled by the codeword.

In one aspect, N different phase shifted versions of the input signal are separated by a minimum phase angle calculated as 360°/N. Two adjacent source-coupled transistor pairs may be supplied a portion of the tail current. The two adjacent source-coupled transistor pairs may receive phase shifted versions of the input signal that are separated by the minimum phase angle. In an example where the phase interpolator has eight source-coupled transistor pairs, eight different phase shifted versions of the input signal are separated by a minimum phase angle of 45° and the adjacent source-coupled transistor pairs may receive phase shifted versions of the input signal that are separated by 45°.

DETAILED DESCRIPTION

Figure 1:
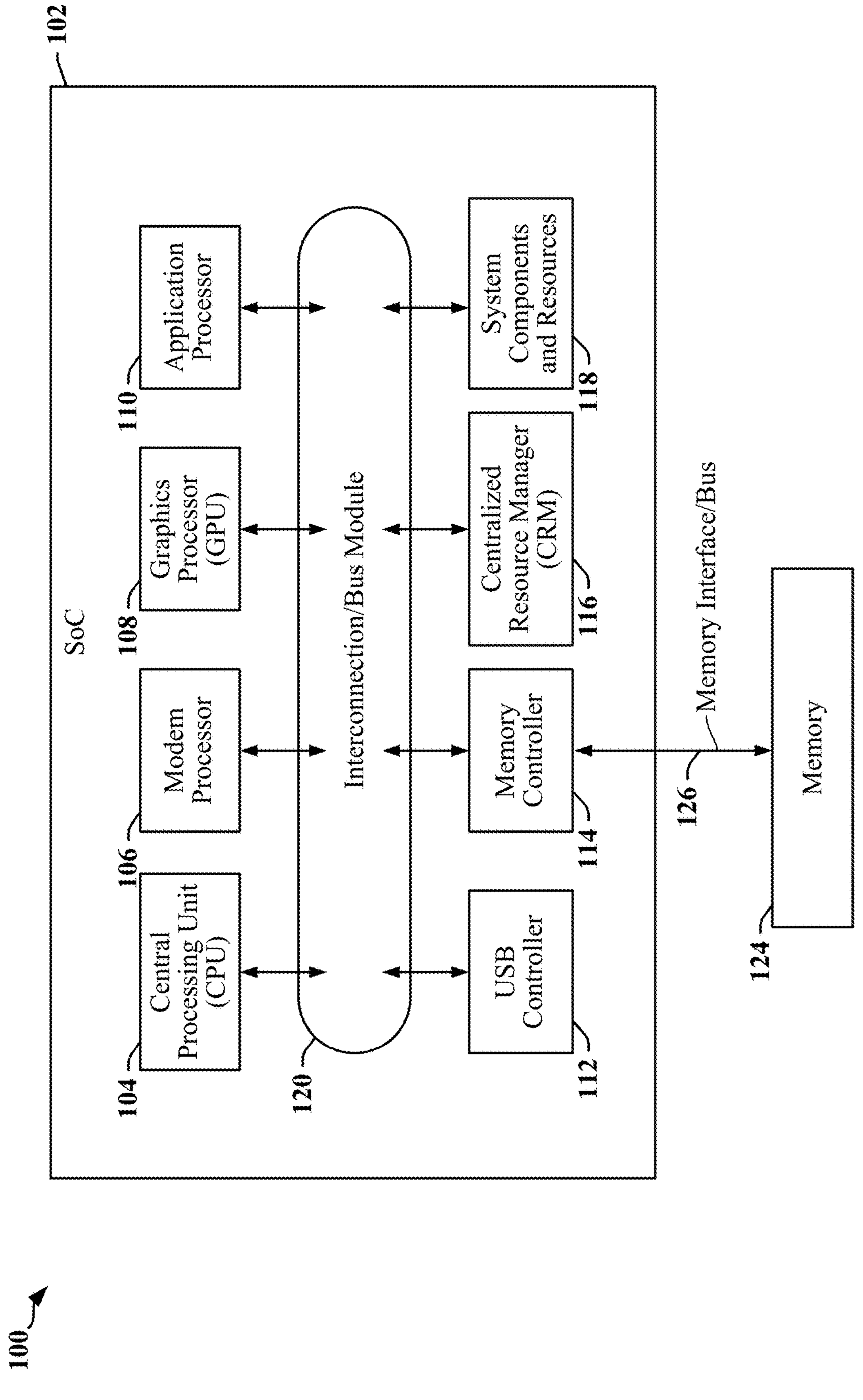
FIG. 1 illustrates an example of a system that includes may be adapted or configured in accordance with certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects. The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., read only memory (ROM), random access memory (RAM), flash, etc.), and resources (e.g., timers, voltage regulators, oscillators, etc.), any or all of which may be included in one or more cores.

Several aspects of the invention will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system. The terms "computing device" and "mobile device" are used interchangeably herein. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

Data communication links may be deployed to facilitate communication between IC devices that may be mounted on a printed circuit board (PCB) or on a substrate material. Data communication links may be provided to couple functional components and circuits provided within an IC device. In one example, a data communication link may be provided in an SoC or another type of IC device to connect processors with modems and other peripherals. Data communication links may be operated in accordance with industry or proprietary standards or protocols associated with certain functions or types of devices. According to certain aspects of the disclosure, a serial data link may be used to interconnect electronic devices that are subcomponents of an apparatus such as a cellular phone, a smart phone, a session initiation protocol (SIP) phone, a laptop, a notebook, a netbook, a smartbook, a personal digital assistant (PDA), a satellite radio, a global positioning system (GPS) device, a smart home device, intelligent lighting, a multimedia device, a video device, a digital audio player (e.g., MP3 player), a camera, a game console, an entertainment device, a vehicle component, a wearable computing device (e.g., a smart watch, a health or fitness tracker, eyewear, etc.), an appliance, a sensor, a security device, a vending machine, a smart meter, a drone, a multicopter, or any other similar functioning device.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions. Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language.

Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.). Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs.

Certain aspects of this disclosure relate to circuits that can be used in high-speed communication interfaces. In one example, a high-speed communication interface may be implemented using high-speed serializer-deserializer (SerDes) circuits. In another example, circuits are described that can be deployed in the analog front-end (AFE) of a receiver. In some examples, an AFE gain stage may include, clock generators, phase interpolators, equalizers such as a decision-feedback equalizer (DFE), variable-gain amplifiers, buffers, summers, and so on.

FIG. 1 illustrates example of a system 100 that includes components and interconnections that are implemented within a system-on-chip (the SoC 102) or other processing circuit. The SoC 102 may implement certain bus interface circuits in accordance with certain aspects of this disclosure. Certain features, techniques and control systems may be implemented by the SoC 102 using some combination of processors, controllers and combinational logic circuits. The illustrated SoC 102 includes a number of heterogeneous processors, such as a central processing unit (CPU) 104, a modem processor 106, a graphics processor 108, and an application processor 110. Each processor 104, 106, 108, 110, may include one or more cores, and each processor/core may perform operations independent of the other processors/cores. The processors 104, 106, 108, 110 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources including power distribution networks that include power rails, for example. Proximately locating cores can enable more coordinated cooperation between cores.

The SoC 102 may include system components and resources 118 for managing sensor data, analog-to-digital conversions, and/or wireless data transmissions, and for performing other specialized operations (e.g., decoding high-definition video, video processing, etc.). System components and resources 118 may also include components such as voltage regulators, oscillators, phase-locked loops (PLLs), peripheral bridges, data controllers, system controllers, access ports, timers, and/or other similar components used to support the processors and software clients running on the computing device. The system components and resources 118 may also include circuitry for interfacing with peripheral devices, such as cameras, electronic displays, wireless communication devices, external memory chips, etc.

The SoC 102 may further include a Universal Serial Bus (USB) or other serial bus controller 112, one or more memory controllers 114, and a centralized resource manager (CRM) 116. The SoC 102 may also include an input/output module (not illustrated) for communicating with resources external to the SoC, each of which may be shared by two or more of the internal SoC components.

The processors 104, 106, 108, 110 may be interconnected to the USB controller 112, the memory controller 114, system components and resources 118, CRM 116, and/or other system components via an interconnection/bus module 120, which may include an array of reconfigurable logic gates and/or implement a bus architecture. Communications may also be provided by advanced interconnects, such as high performance networks on chip (NoCs).

The interconnection/bus module 120 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 120 may implement an arbitration scheme to prevent multiple master components from attempting to drive the bus simultaneously. The memory controller 114 may be a specialized hardware module configured to manage the flow of data to and from a memory 124 via a memory interface/bus 126.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 102.

Figure 2:
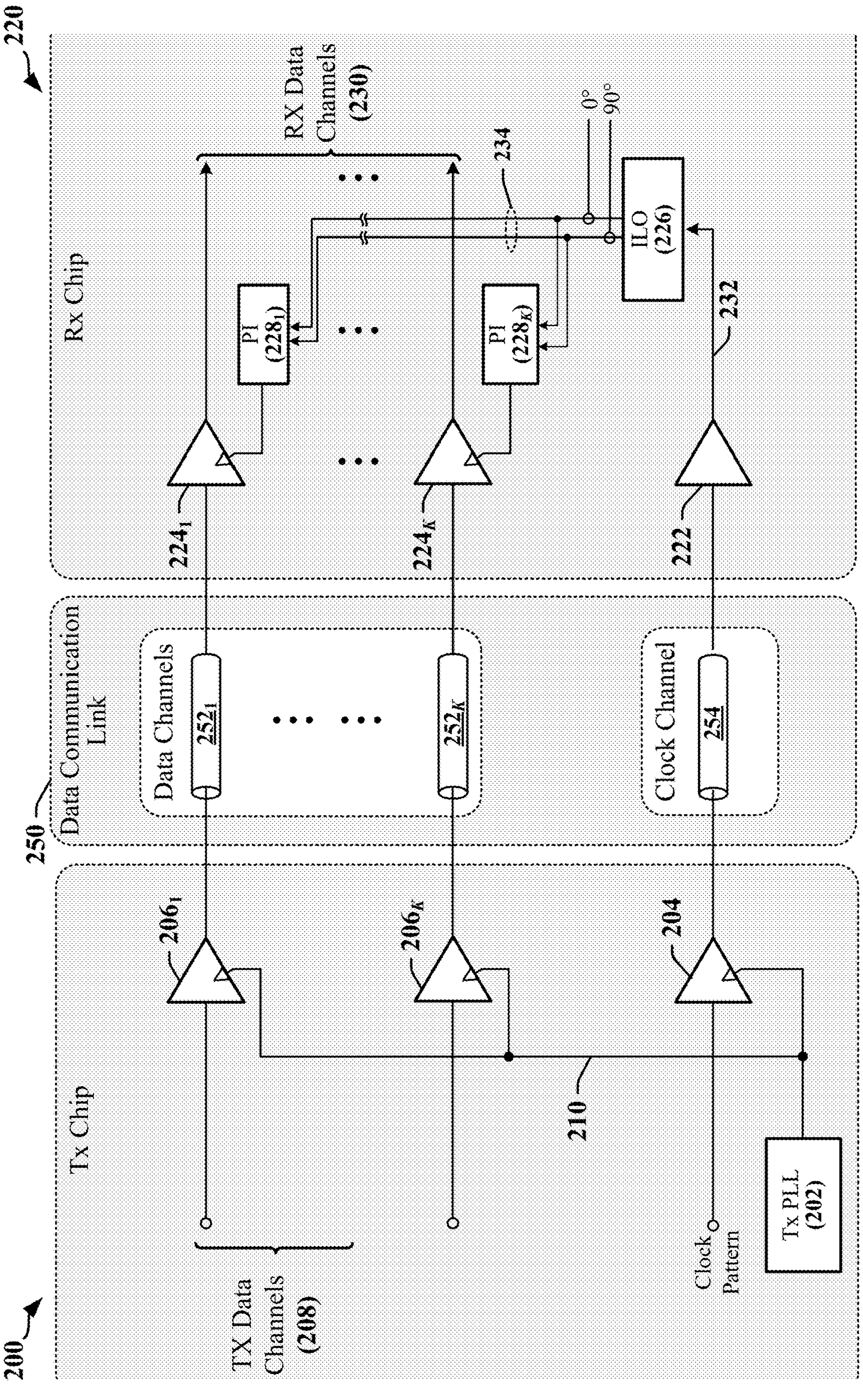
FIG. 2 illustrates an example of a system that employs a multi-channel data communication link to couple a transmitting device with a receiving device in accordance with certain aspects of the present disclosure.

FIG. 2 illustrates an example of a system that employs a multi-channel data communication link 250 to couple a transmitting device 200 with a receiving device 220. The data communication link 250 includes data channels $\mathbf{252}_1$-$\mathbf{252}_K$ that each provide a transmission medium through which signals propagate from a first device to a second device. In the illustrated example, the transmitting device 200 can be configured to transmit data signals over one or more data channels $\mathbf{252}_1$-$\mathbf{252}_K$ in accordance with timing information provided by a clock signal transmitted over a clock channel 254. The transmitting device 200 may include serializers (not shown) configured to convert parallel data into serial data for transmission over the data channels $\mathbf{252}_1$-$\mathbf{252}_K$. The transmitting device 200 further includes data line drivers $\mathbf{206}_1$-$\mathbf{206}_K$ configured to generate data signals over the one or more data channels $\mathbf{252}_1$-$\mathbf{252}_K$ to the receiving device 220 through the data communication link 250 in accordance with timing information provided by a clock signal forwarded by a clock line driver 204 over a clock channel 254.

Clock forwarding is common in communication systems, and provides the benefit that a phase locked loop (PLL) and other clock recovery circuits are not required in the receiving device 220. Long term jitter originating with a PLL 202 in the transmitting device 200 is transparent to the system when a clock signal is forwarded. Typically, only one phase of the transmitter-generated clock signal is forwarded to conserve power and the space that would be occupied by additional clock channels. In some examples, multiple phases of the transmitter-generated clock signal are forwarded. In some examples, the transmitter-generated clock signal is forwarded as a differential clock signal.

The receiving device 220 may be configured to receive and process the data signals. In some implementations, the receiving device 220 can generate additional phases of the clock signal to obtain in-phase and quadrature (I/Q) versions of the clock signal to be used by phase interpolators $\mathbf{228}_1$-$\mathbf{228}_K$. A quadrature signal has phase that is shifted by 90° with respect to an in-phase signal. The phase interpolators $\mathbf{228}_1$-$\mathbf{228}_K$ may be used to align clock signals with received data signals to enable reliable sampling of the data signals, for example. The phase interpolators $\mathbf{228}_1$-$\mathbf{228}_K$ may provide outputs that are phase-adjusted or phase-corrected I/Q versions of the clock signal. In one example, the outputs of each of the phase interpolators $\mathbf{228}_1$-$\mathbf{228}_K$ are provided to sampling circuits $\mathbf{224}_1$-$\mathbf{224}_K$.

In some implementations, the receiving device 220 includes an injection-locked oscillator (ILO) that receives the clock signal from a line receiver 222 coupled to the clock channel 254 and generates phase-shifted versions 234 of the clock signal, including I/Q versions of the clock signal. Oscillators are fundamental building blocks of modern electronics and most often are implemented as ring oscillators (ROs), which can offer advantages over other types of oscillator including reduced area footprint, power efficiency and scalability with technological process.

The wide range of possible operating frequencies to be supported in certain applications can result in increased complexity of clock generation circuits in the receiving device 220. Phase interpolators $\mathbf{228}_1$-$\mathbf{228}_K$ that are used to generate sampling clock signals may be required to scale for a wide range of frequency operation. For example, the phase interpolators $\mathbf{228}_1$-$\mathbf{228}_K$ may be required to operate reliably within a frequency range of between 200 Mhz and 6.4 GHz.

Certain aspects of this disclosure provide a phase interpolator that can be configured to operate within the 200 Mhz and 6.4 GHz, for example. Certain implementations of the presently disclosed phase interpolator can be operated at higher and lower frequencies as needed to generate fine delays used within a receiving device.

Figure 3:
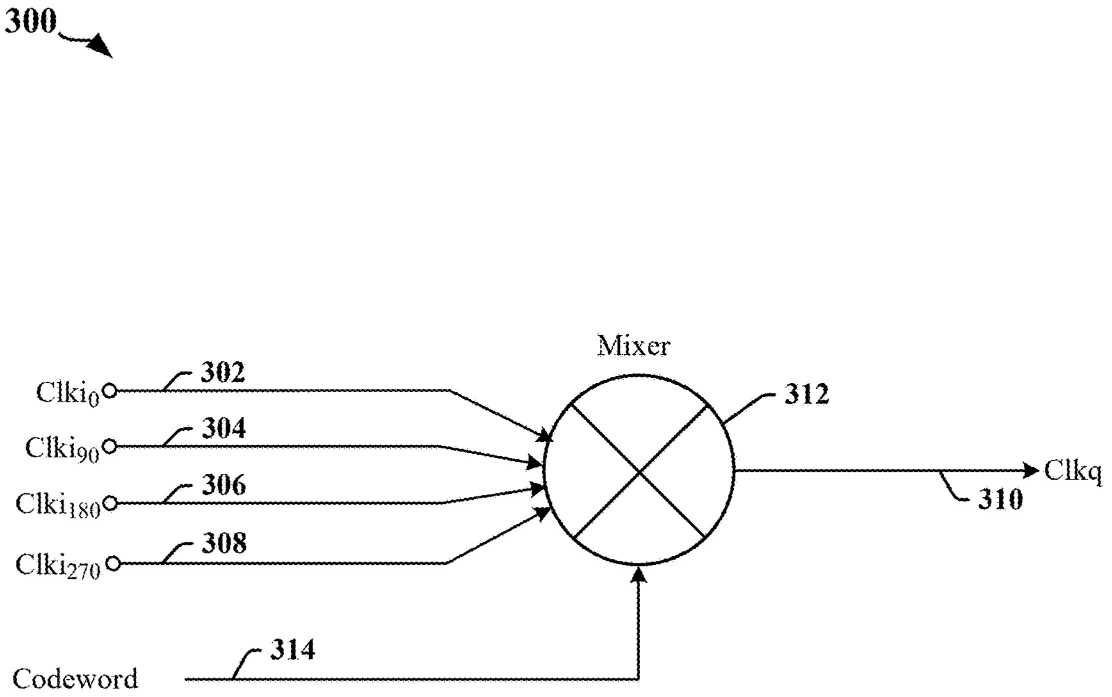
FIG. 3 illustrates an example of a phase interpolator circuit that may be adapted for use in systems configured in accordance with certain aspects of this disclosure.

FIG. 3 illustrates an example of a phase interpolator 300 that may be adapted for use in systems configured in accordance with certain aspects of this disclosure. The phase interpolator 300 includes a phase mixing circuit 312 (a.k.a. a mixer) that may be used to generate in-phase and quadrature-phase clock signals. The phase mixing circuit 312 that may be implemented using analog devices, digital devices or some combination of analog and digital devices. The phase mixing circuit 312 may be configured using a codeword 314 that selects a phase shift to be introduced between an in-phase input signal (represented by the $Clki_0$ signal 302) and an output signal (the Clkq signal 310). The codeword 314 may be configured during system design, integration, initialization or during a calibration or training procedure. In some instances, the calibration or training procedure may include measuring the phase shift between the $Clki_0$ signal 302 and the Clkq signal 310, and adjusting the codeword 314 when the measured phase shift varies or deviates from a nominal or desired phase shift.

The phase mixing circuit 312 receives the $Clki_0$ signal 302 and three phase shifted version of the $Clki_0$ signal 302. In the illustrated example, the $Clki_{90}$ signal 304 is phase shifted by 90° with respect to the $Clki_0$ signal 302, the $Clki_{180}$ signal 306 is phase shifted by 180° with respect to the $Clki_0$ signal 302, and the $Clki_{270}$ signal 308 is phase shifted by 270° with respect to the $Clki_0$ signal 302. These four different phase shifted versions of the input signal are separated from one another by a minimum phase angle of 90°. The Clkq signal 310 may be generated as a weighted summation of the $Clki_0$ signal 302, the $Clki_{90}$ signal 304, the $Clki_{180}$ signal 306, and the $Clki_{270}$ signal 308. In some implementations, the codeword 314 defines the weights applied to the $Clki_0$ signal 302, the $Clki_{90}$ signal 304, the $Clki_{180}$ signal 306 and the $Clki_{270}$ signal 308.

Figure 4:
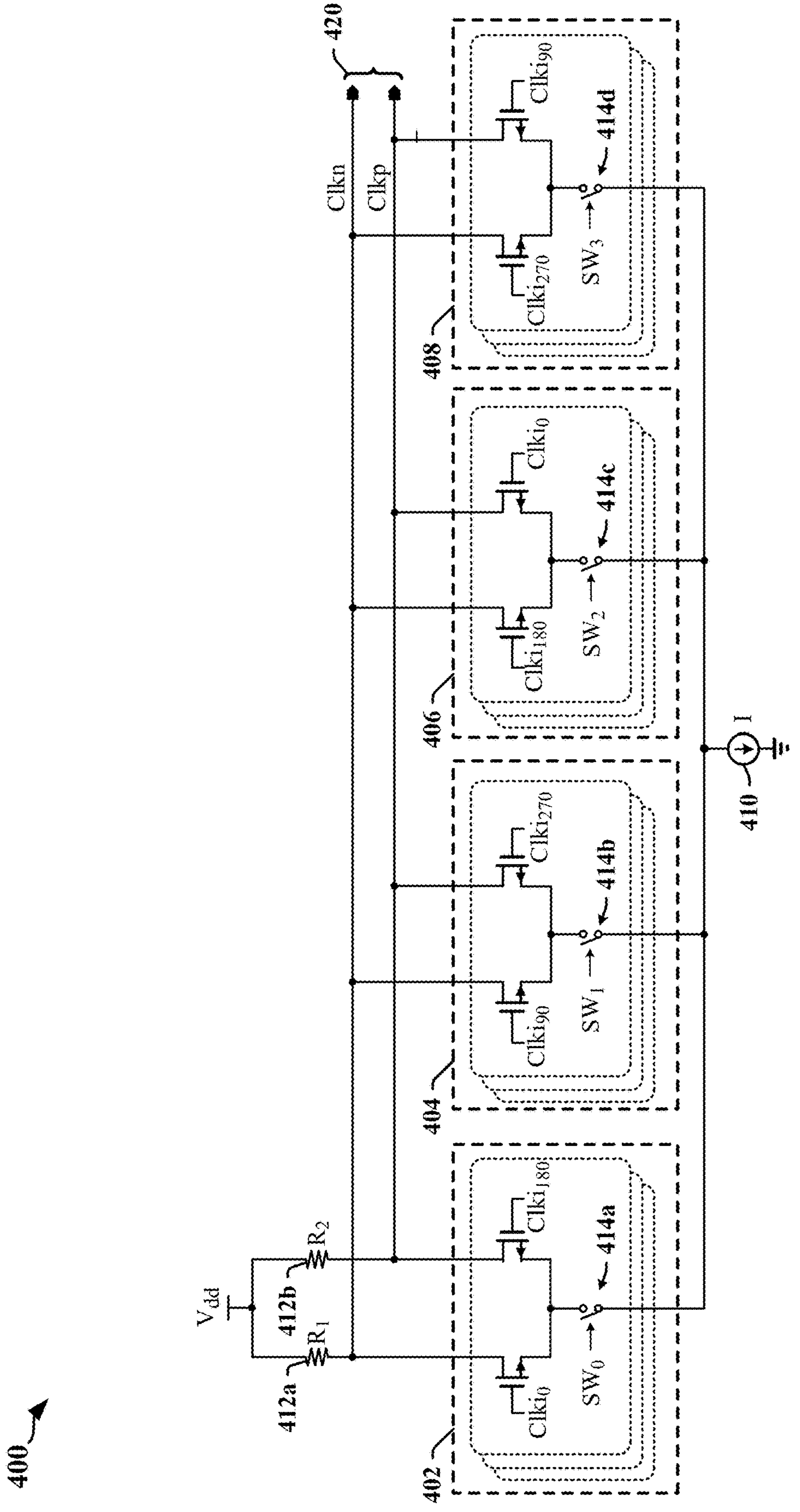
FIG. 4 illustrates an example of a phase interpolator that may be configured using a codeword in accordance with certain aspects of this disclosure.

FIG. 4 illustrates an example of a phase interpolator 400 that can be configured using a codeword in accordance with certain aspects of this disclosure. The phase interpolator 400 may be characterized as an integrating-mode phase interpolator, in which voltage slopes of the output signals are generated through the integration of phase-shifted weighted current sources. The voltage slopes of the output signals determine the timing of signaling state transitions through threshold levels, and can thereby adjust or introduce delays in the signaling state transitions. These delays in signaling state transitions manifest as phase shifts between input and output signals.

In the illustrated example, the phase interpolator 400 includes two load resistors 412*a*, 412*b* and four subcircuits 402, 404, 406, 408. A tail current (I) provided by current source 410 is fixed and provided to all subcircuits 402, 404, 406, 408. Each of the four subcircuits 402, 404, 406, 408 includes multiple driver segments, which may also be referred to herein as driver slices. Each driver segment includes a pair of source-coupled transistors that can be turned on or off using a switch 414*a*, 414*b*, 414*c*, 414*d* provided in the corresponding driver segment. Each switch 414*a*, 414*b*, 414*c*, 414*d* couples the sources of a corresponding pair of source-coupled transistors to the current source 410 when the switch is closed and to decouple the sources of the corresponding pair of source-coupled transistors from the current source 410 when the switch is open. A pair of source-coupled transistors can operate as a transconductance amplifier when the corresponding switch is closed and tail current flows through the pair of source-coupled transistors.

In various examples, the phase interpolator 400 can be controlled using a control codeword. The control codeword may be encoded using binary or unary encoding. Unary encoding, which may be referred to as thermometer encoding, represents data in the quantity of bits set to '1' that precede a terminating '0', or the quantity of bits set to '0' that precede a terminating '1'. Thus, in one embodiment, a total current flowing through each of the two load resistors 412*a*, 412*b* is controlled using thermometer coding in which the number of ones in the code selects a number of segments in which one or more pairs of transistors are to be turned on. The ratio of the number of pairs of transistors be turned on in a first subcircuit to the number of pairs of transistors be turned on in an adjacent subcircuit determines the degree of the phase shift provided by the phase interpolator 400.

Thermometer codes may be used to control the switches 414*a*, 414*b*, 414*c*, 414*d*. In some implementations, the thermometer codes can be configured such that the number of pairs turned on in the phase interpolator 400 remains constant. The tail current provided by current source 410 may be divided among the four subcircuits 402, 404, 406, 408 according to the number of switches 414*a*, 414*b*, 414*c*, 414*d* turned on in each subcircuit 402, 404, 406, 408. In one example, the phase interpolator 400 provides a differential output signal 420 that has a 0° phase shift when all of the pairs of the first subcircuit 402 are turned on. The differential output signal 420 may be considered to be in-phase with the input signal when the phase shift is 0°. In another example, the phase interpolator 400 provides the differential output signal 420 with a 90° phase shift when all of the transistor pairs in the second subcircuit 404 are turned on. In other examples, the phase interpolator 400 can provide the differential output signal 420 with a phase shift between 0° and 90° degrees by controlling the numbers of transistor pairs in the first subcircuit 402 and the second subcircuit 404 that are turned on. In the latter examples, the transistor pairs in the third subcircuit 406 and the fourth subcircuit 408 are turned off. In various examples, pairs of transistors in two adjacent subcircuits 402/404, 404/406, 406/408 or 408/402 are turned on to obtain a desired phase shift in the output signal 420. The first subcircuit 402 and the fourth subcircuit 408 are regarded as adjacent subcircuits.

The illustrated phase interpolator 400 is implemented using current-mode logic (CML) circuits. Each pair of transistors in each subcircuit 402, 404, 406, 408 is configured as a transconductance amplifier. A transconductance amplifier is an amplifier that provides an output current proportional to a received input voltage. The gain of a transconductance amplifier may be stated as $g_m$*$R_L$, where $g_m$ represents conductance of the transconductance amplifier and $R_L$ is the output loading resistance. Reliable operation of the phase interpolator circuit requires linearity of operation across all output phase values.

Linearity of the phase interpolator 400 may be characterized or measured using phase differential nonlinearity (DNL) and/or phase integral nonlinearity (INL). PNL and INL can contribute to deterministic jitter in the phase interpolator output. In an ideal phase interpolator, each increment or decrement of a value encoded in a codeword that controls the current source 410 produces the same increase or decrease in amplitude of the tail current provided by current source 410. The illustrated phase interpolator 400 may operate in a linear manner when each increment or decrement of the value encoded in a codeword that controls the configuration of the switches 414*a*, 414*b*, 414*c*, 414*d* in the driver segments produces the same increase or decrease in phase shift in the differential output signal 420 of the phase interpolator 400.

In practice, the phase interpolator 400 is affected by manufacturing process, voltage or temperature (PVT) variations that can affect the operation of transistors and other components in a data communication interface. Furthermore, circuit design can also introduce nonlinearities. For example, the phase interpolator 400 may be affected by phase DNL, which may be defined as the deviation of the phase shift in the differential output signal 420 of the phase interpolator 400 from the ideal or expected phase shift for each value of the codeword. INL may be defined as the deviation of the phase shift in the differential output signal 420 of the phase interpolator 400 from the ideal or expected phase shift for an individual codeword value. The phase interpolator 400 may be considered to operate with linearity when a step increase in a control value results in a fixed, expected or nominal step increase in phase shift of the output signal with respect to the input signal.

In general, for CML type phase interpolators, the unit current step is fixed with the same value across PI codes. However, the current (I) and $g_m$ has a square root relationship:

$$g_m = \sqrt{2\mu C_{ox}\left(\frac{W}{L}\right)I}, \qquad \text{(Eq. 1)}$$

where: μ is effective charge carrier mobility, $C_{ox}$ is the capacitance of the gate oxide layer of the transistors W is the gate width of the transistors, and L is the gate length of the transistors, and I is the drain to source current through the transistors.

The square root relationship between current and $g_m$ is non-linear and can result in non-linear operation of the phase interpolator 400.

The phase interpolator 400 illustrated in FIG. 4 includes transistor pairs that are implemented using n-type metal-oxide-semiconductor (NMOS) field effect transistors. However, the concepts disclosed herein can be applied to phase interpolators implemented using NMOS field effect transistors or p-type metal-oxide-semiconductor (PMOS) field effect transistors. The illustrated phase interpolator 400 operates using four phase-shifted versions of an input signal. The versions of the input signal are phase shifted in increments of 90° and include an in-phase version of the input signal ($Clki_0$), a version of the input signal with a 90° phase shift ($Clki_{90}$), a version of the input signal with a 180° phase shift ($Clki_{180}$), and a version of the input signal with a 270° phase shift ($Clki_{270}$).

Degradation of phase interpolator linearity tends to increase with input phase separation. Accordingly, eight or more phases may be provided to a phase interpolator in high-speed data communication links. In one example, eight phases may be generated by some combination of clock generating circuits including, for example, a delay-locked loop clock generating circuit, an eight-phase injection-locked ring oscillator, or the like.

Figure 5:
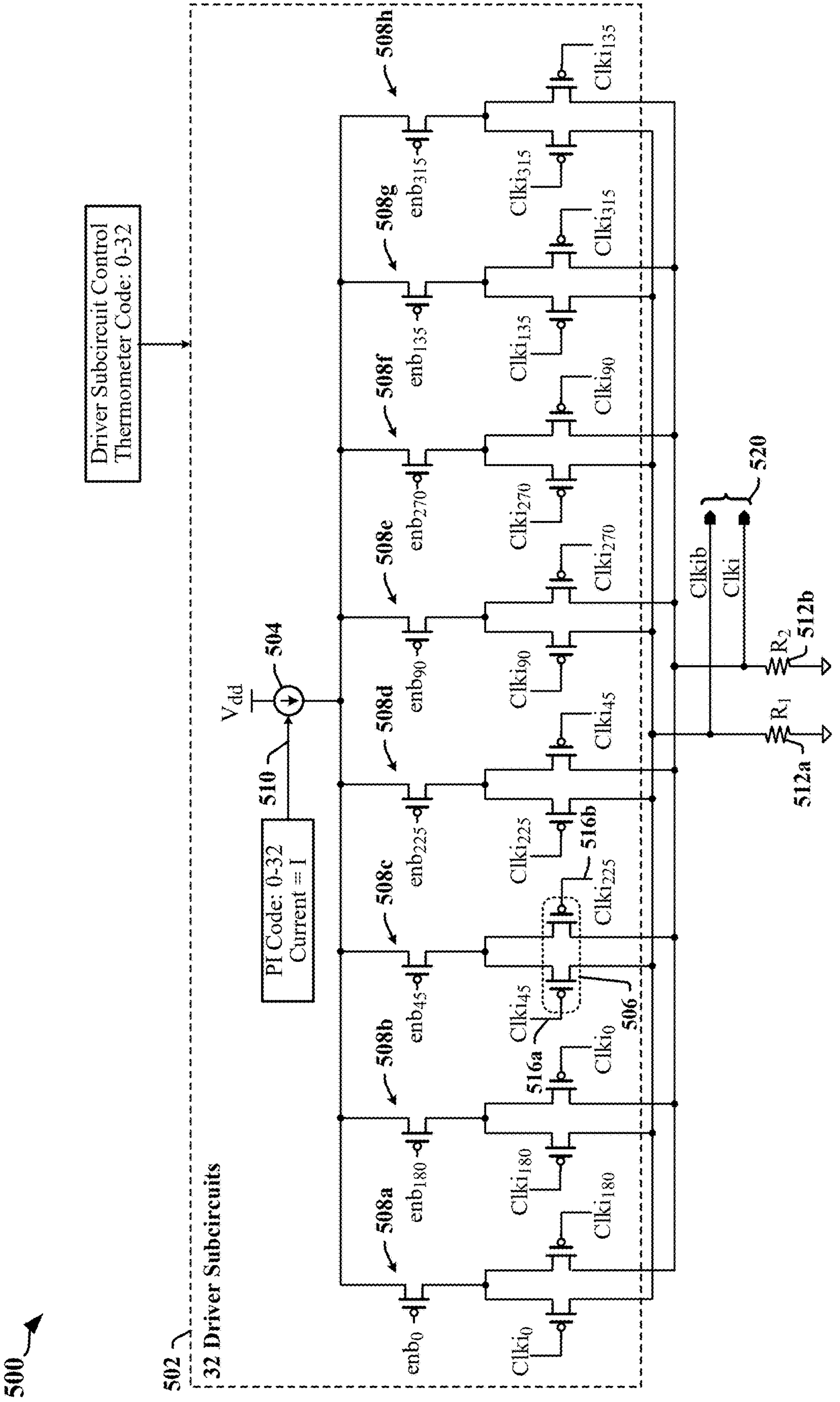
FIG. 5 illustrates an example of an integrating-mode phase interpolator that may be adapted or configured in accordance with certain aspects of the present disclosure.

FIG. 5 illustrates an example of a phase interpolator 500 in which voltage slopes of the output signals 520 are generated through the integration of phase-shifted weighted current sources. The output of the phase interpolator 500 may be provided as a voltage developed across the load resistors 512*a*, 512*b*. The phase interpolator 500 receives eight different phase-shifted versions of an input signal. The different versions of the input signal are phase shifted in increments of 45°. The illustrated phase interpolator 500 includes two load resistors 512*a*, 512*b* and 32 driver slices (driver segments), including the illustrated driver subcircuit 502. Each driver subcircuit 502 includes eight pairs of input transistors 516*a*-516*h* controlled by eight gating transistors 508*a*-508*h*. Each of the different phase-shifted versions of the input signal is provided to the gates of a pair of input transistors 516*a*-516*h*. Each differential signal provided to an input transistor 516*a*-516*h* includes a first signal that has a defined phase relationship with the input signal and a second signal that is phase shifted by 180° with respect to the first signal. For example, input transistor pair 506 receives a differential signal that is a 45° phase shifted version of the input signal and that includes complementary signals 516*a*, 516*b* that are 180° phase shifted with respect to one other.

Each driver subcircuit 502 includes a current source 504 that is configured to provide a tail current to one or more enabled pairs of input transistors in the driver subcircuit 502. A pair of input transistors 516*a*-516*h* is enabled when a corresponding gating transistor 508*a*-508*h* is turned on in the corresponding driver subcircuit 502. The input transistors in a driver subcircuit 502 can be turned on or off using a thermometer code to control the gating transistors 508*a*-508*h*.

The number of driver slices and the magnitude of the current produced by the current source 504 may be controlled by the same thermometer code, or by thermometer codes that are calibrated to one another. In the illustrated example, a codeword is encoded in a signal 510 used to configure the current source 504. The current produced by the current source 504 may be increased to accommodate changes in the number of enabled pairs of input transistors. In one example, the current produced by the current source 504 is controlled to ensure that the tail current provided to the input transistor pair 506 is constant. Concurrent control of the tail current and aggregate channel size of the input field effect transistors can enable the phase interpolator 400 to operate with linearity. In some implementations, step increases in the current produced by the current source 504 are matched by a step increase in the number of input field effect transistors, and these increases can be indicated using a value encoded in a thermometer code. In one example, tail current may be increased by a multiple representing the step increase in the number of input field effect transistors, such that $g_m$ as calculated in equation Eq. 1 is substantially unchanged. In this example, a step change in the number of input field effect transistors relates to a step change in the effective or aggregate field effect transistor gate length.

The inherently linear phase interpolator 500 may be unsuitable for high-speed applications due to large input and output loading attributable to the number of input transistors in each driver subcircuit 502. In the illustrated example, 32 pairs of input transistors receive inputs and drive the output of the phase interpolator 500. In some instances, the input and output loading are largely capacitive, with increasing effect as signal frequency increases.

Figure 6:
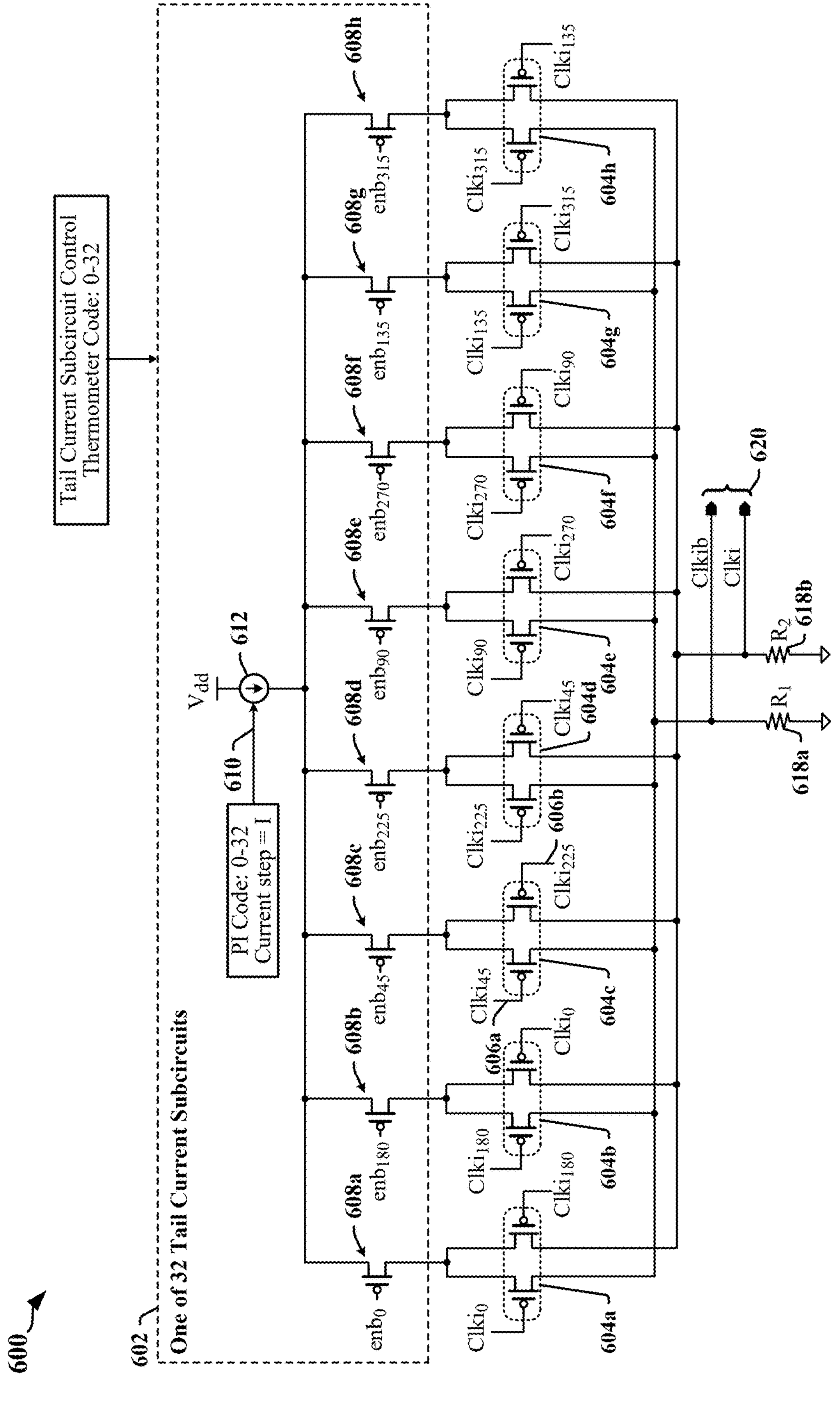
FIG. 6 illustrates an example of a phase interpolator that can operate at higher frequencies and that may be adapted or configured in accordance with certain aspects of the present disclosure.

FIG. 6 illustrates an example of a phase interpolator 600 that can operate at higher frequencies than the phase interpolator 500 illustrated in FIG. 5. The voltage slopes of the output signals of the phase interpolator 600 are generated through the integration of phase-shifted weighted current sources. The phase interpolator 600 includes eight transistor pairs 604*a*-604*h*, eight gating transistors 608*a*-608*h* and 32 tail current subcircuits (tail current generating segments). The illustrated tail current subcircuit 602 is representative of all 32 tail current subcircuits. The illustrated tail current subcircuit 602 includes a current source 612 that is configured to provide a tail current to one or more enabled transistor pairs 604*a*-604*h*. For the purposes of this disclosure, an enabled transistor pair 604*a*-604*h* receives a tail current and tail current is suppressed in a disabled transistor pair 604*a*-604*h*. A transistor pair 604*a*-604*h* may receive a tail current and drive an output when a corresponding gating transistor 608*a*-608*h* is turned on in the tail current subcircuit 602 or when a corresponding gating transistor is turned on in at least one of the other tail current subcircuits.

The phase interpolator 600 receives eight different phase-shifted versions of an input signal. Each of the different phase-shifted versions of the input signal is provided to the gates of the input transistors in a transistor pair 604*a*-604*h*. The different versions of the input signal are phase shifted in increments of 45°. The illustrated phase interpolator 600 includes two load resistors 618*a*, 618*b* that are configured to be driven by the outputs of enabled transistor pairs 604*a*-604*h*. Each transistor pair 604*a*-604*h* receives a differential signal that is a phase shifted version of an input signal. Each differential signal provided to a transistor pair 604*a*-604*h* includes a first signal that has a defined phase relationship with the input signal and a second signal that is phase shifted by 180° with respect to the first signal. For example, transistor pair 604*c* receives a differential signal that is a 45° phase shifted version of the input signal. The differential input signal includes complementary signals 606*a*, 606*b* that are 180° phase shifted with respect to each other (e.g., the $Clki_{45}$ and $Clki_{225}$ signals).

The phase shift in the output of the phase interpolator 600 is determined by enabled transistor pairs 604*a*-604*h* and the relative amplitudes of the tail currents provided to the enabled transistor pairs 604*a*-604*h*. The amplitude of a tail current provided to one of the transistor pairs 604*a*-604*h* is determined by the number of tail current subcircuits that supply tail current to the transistor pair 604*a*-604*h*. In FIG. 6, the illustrated tail current subcircuit 602 supplies tail current to a transistor pair 604*a*-604*h* when the corresponding gating transistor 608*a*-608*h* is turned on. The output 620 of the phase interpolator 600 is a voltage developed across the load resistors 618*a*, 618*b* by the sum of the currents output by the transistor pairs 604*a*-604*h*. In one example, the phase difference between an input signal and a signal at the output of the phase interpolator 600 lies within the range 45° and 90° when each of the transistor pairs 604*c*, 604*e* receive tail currents from one or more tail current subcircuits. In this example, the transistor pair 604*c* receives a differential signal that is a 45° phase shifted version of the input signal and the transistor pair 604*e* receives a differential signal that is a 90° phase shifted version of the input signal.

In the illustrated phase interpolator 600, the amplitude of the tail current provided to one or more transistor pairs 604*a*-604*h* is determined by control signals provided to the current sources in the tail current subcircuits. In one example, the control signal 610 provided to the current source current source 612 in the tail current subcircuit 602 configures current level provided through one or more turned-on gating transistors 608*a*-608*h*. The contribution of the illustrated tail current subcircuit 602 to the phase shift produced by the phase interpolator 600 is based on the combination of gating transistors 608*a*-608*h* that are turned on.

In some instances, a pair of phase-adjacent gating transistors 608*a*/608*c*, 608*c*/608*c*, 608*c*/608*g*, 608*g*/608*b*, 608*b*/608*d*, 608*d*/608*f*, 608*f*/608*h* or 608*h*/608*a* is turned on in the illustrated tail current subcircuit 602. With respect to FIG. 6, a pair of the gating transistors 608*a*-608*h* may be phase-adjacent when configured to provide tail current to corresponding transistor pairs 604*a*-604*h* that receive phase shifted versions of an input signal separated by the minimum phase angle. In the illustrated phase interpolator 600, the minimum phase angle is 45°. In some instances, a single one of the gating transistors 608*a*-608*h* is enabled in the illustrated tail current subcircuit 602. In some instances, more than two of the gating transistors 608*a*-608*h* are enabled in the illustrated tail current subcircuit 602. In some implementations, non-adjacent gating transistors 608*a*-608*h* may be enabled in some of the tail current subcircuits 602.

In some implementations, the current produced by the current source 612 in the illustrated tail current subcircuit 602 may be configured based on the number of turned-on gating transistors 608*a*-608*h*. For example, the current source 612 may be configured to provide a nominal or desired unit current level through each turned-on gating transistor 608*a*-608*h*. In some implementations, the current source 612 may be controlled using a thermometer code to supply current at the unit current level.

Each transistor pair 604*a*-604*h* is configured to operate as a transconductance amplifier that provides an output current proportional to the phase-shifted version of the input signal provided to the gates of its constituent input transistors. The output of each transistor pair 604*a*-604*h* is determined by its conductance gain ($g_m$), which has a non-linear relationship with current level of its tail current (see Eq. 1). While the tail current is expected to change for different desired phase shifts, each of the transistor pairs 604*a*-604*h* comprises a fixed number of input transistors with constant nominal physical characteristics. Accordingly, for the illustrated phase interpolator 600, Eq. 1 can be restated as:

$$g_m = \sqrt{2\mu C_{ox}\left(\frac{W}{L}\right)I} = k\sqrt{I}, \quad \text{(Eq. 2)}$$

$$\text{Where } k = \sqrt{2\mu C_{ox}\left(\frac{W}{L}\right)}.$$

Figure 7:
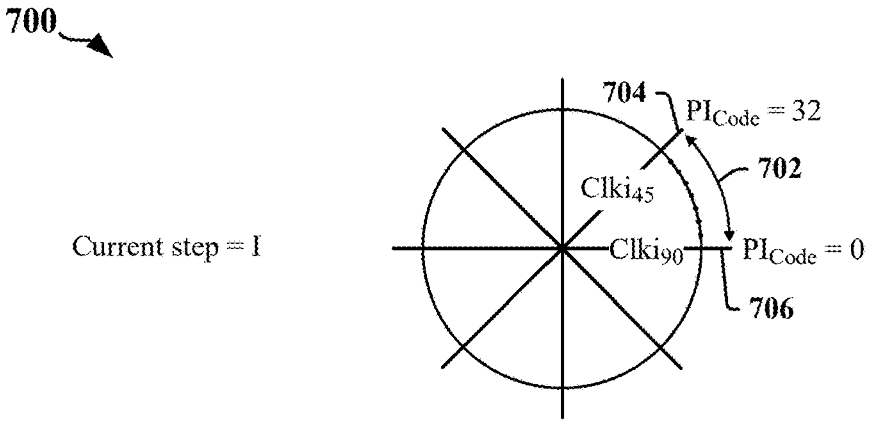
FIG. 7 illustrates certain aspects of the operation of the phase interpolator illustrated in FIG. 6.
Figure 7:
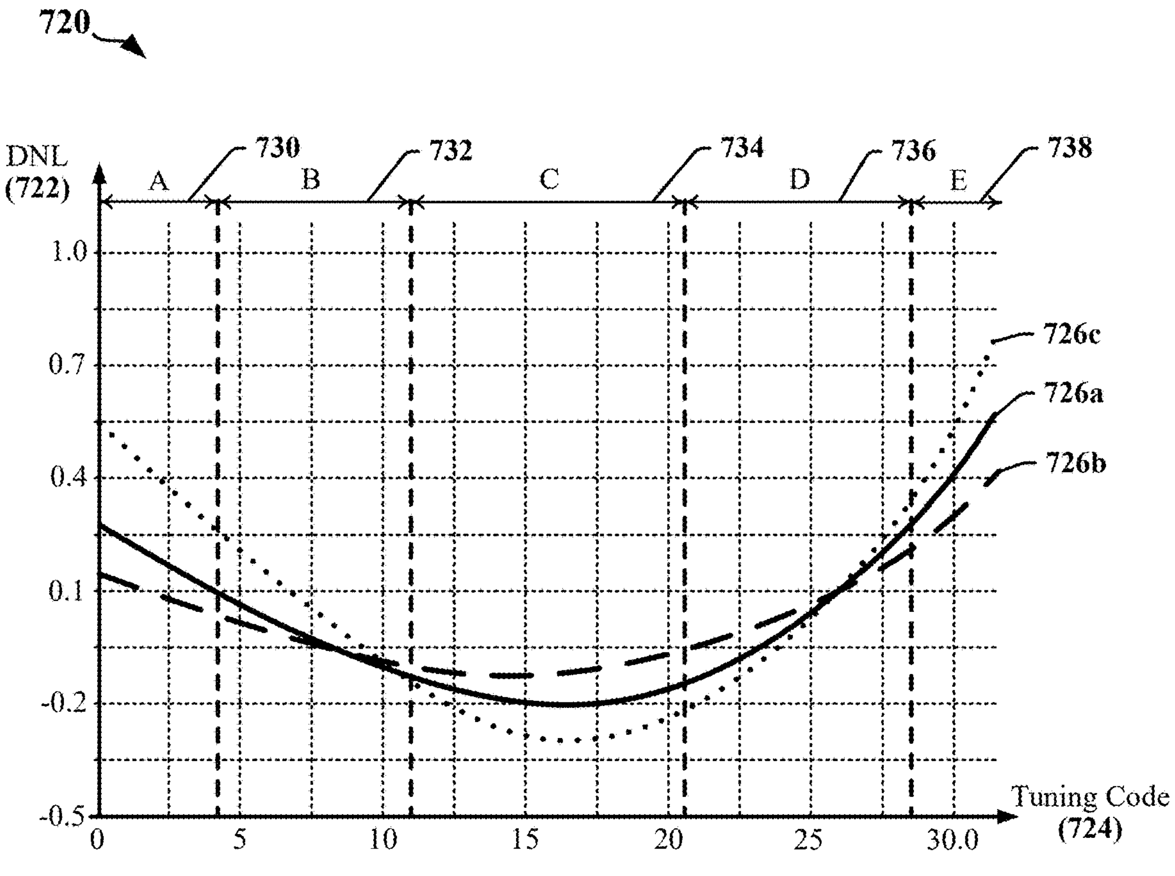

FIG. 7 illustrates certain aspects of the operation of the phase interpolator 600 for different values of k (see Eq. 2). A phase wheel 700 illustrates the use of different combinations of phase-adjacent gating transistors (e.g., phase-adjacent gating transistors 608*a*/608*c*, 608*c*/608*e*, 608*e*/608*g*, 608*g*/608*b*, 608*b/d*, 608*d*/608*f*, 608*f*/608*h* or 608*h*/608*a* in the tail current subcircuit 602 illustrated in FIG. 6). In the example of a phase interpolator 600 configured to provide a phase difference that lies between a 45° phase shift 704 and a 90° phase shift 706, the output phase shift is selectable within a 45° range 702 using a thermometer code that can vary between 0-32. The thermometer code directly controls the number of units of tail current received by the transistor pairs 604*c*, 604*e* by defining the total number of corresponding turned-on gating transistors across the tail current subcircuits.

The graph 720 in FIG. 7 includes curves 726*a*, 726*b*, 726*c* that represent variation of DNL 722 with increasing tuning code 724. The differences in the curves 726*a*, 726*b*, 726*c* represent DNL may be attributable to some combination of variations of k and/or the amplitude of unit tail current level. In the illustrated example, the tuning code 724 may be encoded as a thermometer code. Increments in tuning code 724 produce non-linear phase shifts. Effectively, the change in phase depends to some extent on the absolute value of the tuning code 724 before or after the tuning code 724 is incremented or decremented. The non-linear behavior may be attributable to variations in conductance gain ($g_m$) with tail current. For example, for a defined or nominal unit of tail current ($I_{Unit}$), where a circuit has a leakage current (bleed current) of $2I_{Unit}$, an incremental change in tuning code 724 that increases tail circuit from 0I to $1I_{Unit}$ produces a significantly different change in conductance gain than an incremental change in tuning code 724 that increases tail current from $15I_{Unit}$ to $16I_{Unit}$:

$$g_m = k\times\sqrt{(2+0)I_{Unit}} - k\times\sqrt{(2+1)I_{Unit}} = 0.318\left(k\times\sqrt{I_{Unit}}\right), \text{ and}$$

$$g_m = k\times\sqrt{(2+16)I_{Unit}} - k\times\sqrt{(2+15)I_{Unit}} = 0.120\left(k\times\sqrt{I_{Unit}}\right).$$

In this example, there is a 266% difference in the change in conductance gain.

According to one aspect of this disclosure, two substantially linear operating regions 732, 736 and three nonlinear operating regions 730, 734, 738 may be identified in the graph 720, including A. In a first nonlinear operating region 730, incremental changes in tuning code 724 result in large changes in $g_m$;

B. In a first linear operating region 732, incremental changes in tuning code 724 result in the substantially linear changes in $g_m$;

C. In a second nonlinear operating region 734, incremental changes in tuning code 724 result in smaller changes in $g_m$; and D. In a second linear operating region 736, incremental changes in tuning code 724 result in the substantially linear changes in $g_m$;

E. In a third nonlinear operating region 738, incremental changes in tuning code 724 result in the largest changes in $g_m$; and The presence of nonlinear operating regions 730, 734 and 738 can render the phase interpolator 600 unsuitable for high-data rate applications due to the resultant nonlinear operation, notwithstanding the benefits of using small, constant number of transistor pairs 604*a*-604*h*. Higher data communication rates are associated with reduced sampling time margins and reliable communication of data may be dependent on the ability of a phase interpolator to produce output sampling clocks signals that have low jitter and high linearity. Excessive clock jitter can be expected in high-speed data links due to nonlinearity of the phase interpolator 600. For example, the variable phase steps per tuning code increment can degrade sampling clock accuracy due to jitter.

Certain aspects of the disclosure relate to phase interpolators in a high-frequency interface that can provide high bandwidth operation without sacrificing linearity. Circuits, systems and methods disclosed herein can improve the linearity of a phase interpolator that is implemented using current-mode logic. For example, a phase interpolator may be configured in accordance with certain aspects of this disclosure to modify the amplitude of tail current steps in non-linear regions in response to incremental changes in tuning code to obtain substantial piecewise linearity.

Figure 8:
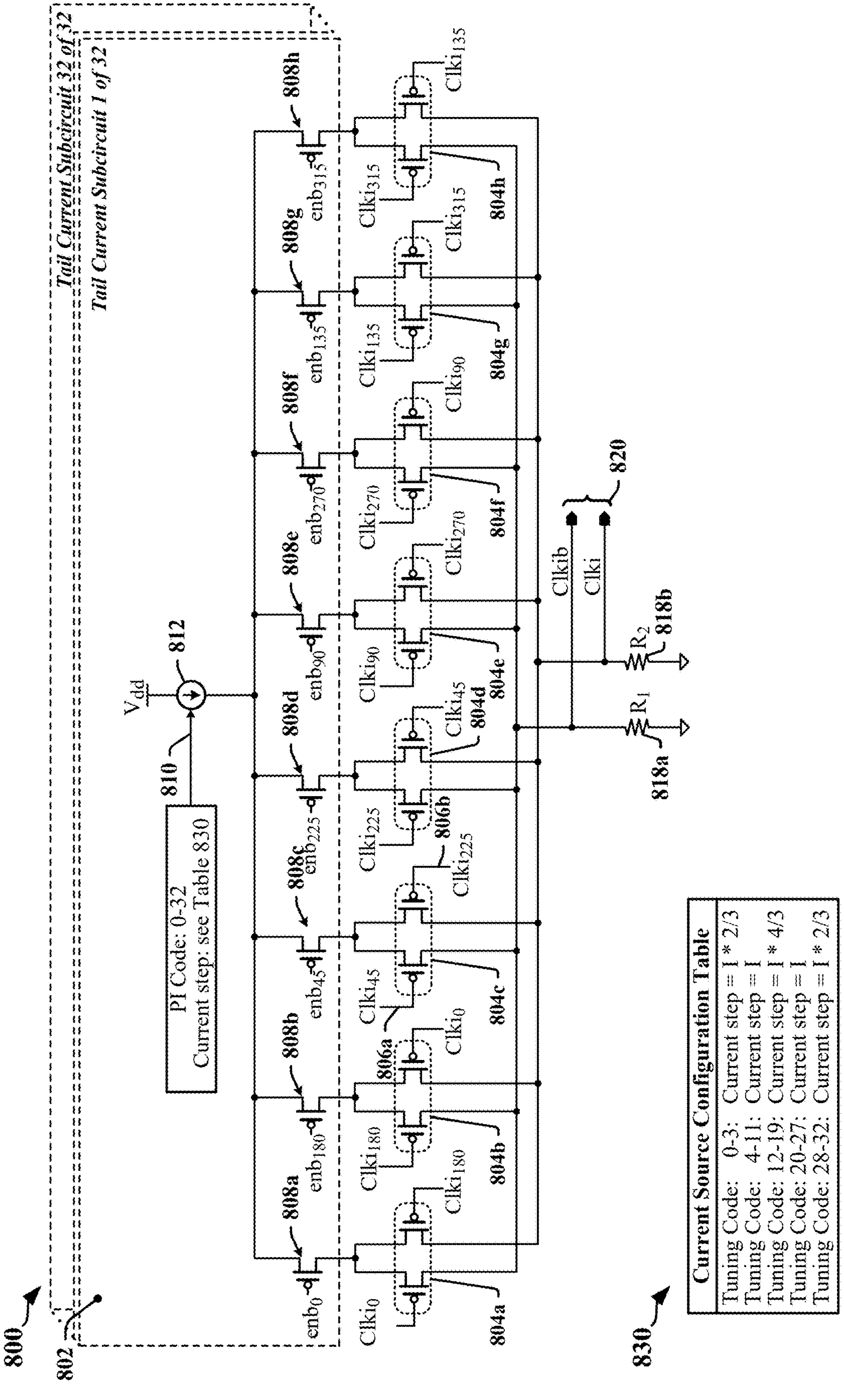
FIG. 8 illustrates an example of a phase interpolator that is configured in accordance with certain aspects of this disclosure.

FIG. 8 illustrates an example of a phase interpolator 800 that is configured in accordance with certain aspects of this disclosure. The phase interpolator 800 may be characterized as an integrating-mode phase interpolator, in which voltage slopes of the output signals are generated through the integration of phase-shifted weighted current sources. The voltage slopes of the output signals determine the timing of signaling state transitions through threshold levels, and can thereby adjust or introduce delays in the signaling state transitions. These delays in signaling state transitions manifest as phase shifts between input and output signals.

The illustrated phase interpolator 800 includes eight transistor pairs 804*a*-804*h* and eight gating transistors 808*a*-808*h* and 32 tail current subcircuits. Each of the transistor pairs 804*a*-804*h* includes a pair of source-coupled transistors configured to sink or source a tail current. An illustrated tail current subcircuit 802, which may be taken as representative of all 32 tail current subcircuits, includes a current source 812 that is configured to generate a current that can be distributed as tail current through gating transistors 808*a*-808*h* to one or more of the transistor pairs 804*a*-804*h*. Other implementations may provide a larger or smaller number of tail current subcircuits.

Each transistor pair 804*a*-804*h* receives a tail current and drives an output when a corresponding gating transistor 808*a*-808*h* is turned on in the illustrated tail current subcircuit 802, or when a corresponding gating transistor is turned on in at least one of the other tail current subcircuits. The phase interpolator 800 includes two load resistors 818*a*, 818*b* that are configured to be driven by the outputs of enabled transistor pairs 804*a*-804*h*. For the purposes of this disclosure, a transistor pair 804*a*-804*h* is enabled when it receives a tail current.

The phase interpolator 800 receives eight different phase-shifted versions of an input signal. Each of the different phase-shifted versions of the input signal is provided as a differential signal to a transistor pair 804*a*-804*h*. The different versions of the input signal are phase shifted in increments of 45°. Each differential signal provided to a transistor pair 804*a*-804*h* includes a first signal that has a defined phase relationship with the input signal and a second signal that is phase shifted by 180° with respect to the first signal. For example, transistor pair 804*c* receives a differential signal that is a 45° phase shifted version of the input signal and that includes complementary signals 806*a*, 806*b* that are 180° phase shifted with respect to one other.

The phase shift between an in-phase version of the input signal and the output of the phase interpolator 800 is determined by the combination of transistor pairs 804*a*-804*h* that receive tail currents and the relative amplitudes of the tail currents. The amplitude of a tail current provided to one of the transistor pairs 804*a*-804*h* is the sum of the tail currents supplied by the tail current subcircuits. In FIG. 8, the illustrated tail current subcircuit 802 may be configured to provide a tail current to one or more of the transistor pairs 804*a*-804*h* when the corresponding gating transistors 808*a*-808*h* are turned on. The output 820 of the phase interpolator 800 may be received as the voltage developed across the load resistors 818*a*, 818*b* by the sum of the currents output by the transistor pairs 804*a*-804*h*. In one example, the phase difference between the in-phase version of the input signal and a signal at the output of the phase interpolator 800 lies between 45° and 90° when each of the transistor pairs 804*c*, 804*e* receive tail currents from one or more tail current subcircuits. For the purposes of this disclosure, an enabled tail current subcircuit includes at least one turned-on gating transistor.

In the illustrated example, the tail current provided to one or more transistor pairs 804*a*-804*h* by a tail current subcircuit is determined by control signals provided to the current sources in the tail current subcircuit. In one example, the control signal 810 provided to the current source 812 in the tail current subcircuit 802 configures the current available to be provided through one or more turned-on gating transistors 808*a*-808*h*. The contribution of the illustrated tail current subcircuit 802 to the phase shift produced by the phase interpolator 800 is based on the combination of gating transistors 808*a*-808*h* that are turned on.

In some instances, a pair of phase-adjacent gating transistors 808*a*/808*c*, 808*c*/808*e*, 808*c*/808*g*, 808*g*/808*b*, 808*b*/808*d*, 808*d*/808*f*, 808*f*/808*h* or 808*h*/808*a* is turned on in the illustrated tail current subcircuit 802. With respect to FIG. 8, a pair of the gating transistors 808*a*-808*h* may be phase-adjacent when configured to provide tail current to corresponding transistor pairs 804*a*-804*h* that receive phase shifted versions of an input signal separated by the minimum phase angle. In the illustrated phase interpolator 800, the minimum phase angle is 45°. In some instances, a single one of the gating transistors 808*a*-808*h* is enabled in the illustrated tail current subcircuit 802. In some instances, more than two of the gating transistors 808*a*-808*h* are enabled in the illustrated tail current subcircuit 802. In some implementations, non-adjacent gating transistors 808*a*-808*h* may be enabled in one or more of the tail current subcircuits 802.

In some implementations, the current produced by the current source 812 in the tail current subcircuit 802 may be configured based on the number of turned-on gating transistors 808*a*-808*h*. For example, the current source 812 may be configured to supply a predefined level of current through a turned-on gating transistor 808*a*-808*h* based on the total number of current sources that are concurrently supplying the turned-on gating transistor 808*a*-808*h*. In some implementations, the magnitude of the current produced by the current source 812 may be controlled in a stepwise manner using a thermometer code. In some instances, different output current levels may be defined for different tail current subcircuits to ensure that a predefined level of aggregate tail current is provided to one or more of the transistor pairs 804*a*-804*h*.

In some implementations, the amplitude of a step increase or amplitude of a step decrease in tail current may vary with operating region (e.g., the operating regions 730, 732, 734, 736 and 738 illustrated in FIG. 7). In some implementations, each tail current subcircuit is configured to supply a current level based on the operating region of the phase interpolator 800. For example, four different tail current levels could be defined for the operating regions 730, 732, 734, 736 and 738 illustrated in FIG. 7 and the current sources in each tail current subcircuit can be configured accordingly.

In some implementations, a first tail current level may be defined as the desired or nominal unit tail current level. The unit tail current level may correspond to the minimum tail current provided to any of the transistor pairs 804*c*, 804*e* through a turned-on gating transistors 808*a*-808*h*. The unit tail current level may also correspond to the step change in tail current provided in response to an incremental change in the tuning code 724 within a linear operating region 732, 736. A second tail current level may be defined as the desired or nominal step change in tail current level to be provided in response to an incremental change in the tuning code 724 within the first nonlinear operating region 730. A third tail current level may be defined as the desired or nominal step change in tail current level to be provided in response to an incremental change in the tuning code 724 within the second nonlinear operating region 732. A fourth tail current level may be defined as the desired or nominal step change in tail current level to be provided in response to an incremental change in the tuning code 724 within a third nonlinear operating region 734.

In the illustrated phase interpolator 800, the current sources in the tail current subcircuits may be configured to respond to incremental changes in the tuning code 724 in a manner that compensates for the nonlinear relationship between current and transconductance gain of the transistor pairs 804*a*-804*h*. One example of a current source configuration table 830 is provided. In this current source configuration table 830, tuning code values are associated with linear and non-linear operating regions and indexed to a step value for incremental changes in tuning code. Other current source configuration tables may be defined based on the physical characteristics of the transistors used to implement the transistor pairs 804*a*-804*h*, the number of the transistor pairs 804*a*-804*h*, the configuration of the load resistors 818*a*, 818*b*, operating voltage, etc. The current source configuration table 830 may be embodied in a lookup table that indexes operating regions to codes that configure current sources to produce a current equal to the desired or nominal step change in tail current level to be provided by a corresponding tail current subcircuit. In some instances, the current source configuration table 830 may be hard coded into combinational logic within an interface circuit, the phase interpolator 800 or a processing circuit or controller that can configure the phase interpolator.

Figure 9:
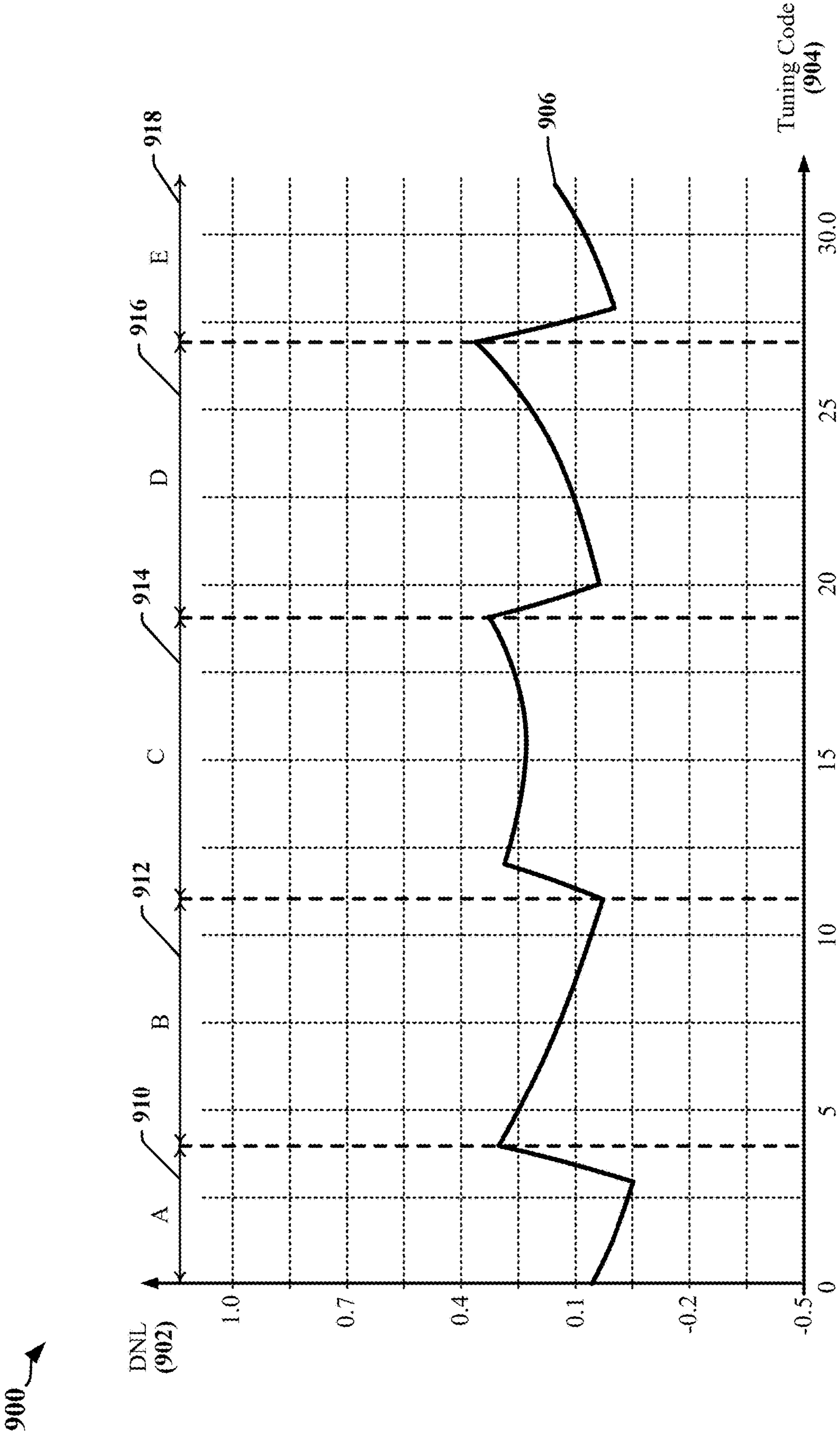
FIG. 9 includes a graph that illustrates certain aspects of the operation of the phase interpolator illustrated in FIG. 8.

FIG. 9 includes a graph 900 that illustrates certain aspects of the operation of the illustrated phase interpolator 800 at a clock frequency of 16 GHz using the current source configuration table 830. The graph 900 includes an example of a curve 906 that represents variation of DNL 902 with increasing tuning code 904. Tail current is increased by a step that is sized or weighted according to an operating region associated with the initial or subsequent value of the tuning code 904. The curve 906 traverses five operating regions 910, 912, 914, 916 and 918 that correspond to the five operating regions 730, 732, 734, 736 and 738 illustrated in the graph 720 provided in FIG. 7. In FIG. 9, the five operating regions 910, 912, 914, 916 and 918 may be defined according to the initial or subsequent value of the tuning code 904 as follows:

(a) Tuning code values 0-3 fall within a first nonlinear operating region 910, and incremental changes in tuning code 904 cause corresponding changes in tail current of $2/3\times I_{Unit}$;

(b) Tuning code values 4-11 fall within a first substantially linear operating region 912, and incremental changes in tuning code 904 cause corresponding changes in tail current of defined or nominal unit of tail current ($I_{Unit}$);

(c) Tuning code values 12-19 fall within a second nonlinear operating region 914, and incremental changes in tuning code 904 cause corresponding changes in tail current of $4/3\times I_{Unit}$;

(d) Tuning code values 20-27 fall within a second substantially linear operating region 916, and incremental changes in tuning code 904 cause corresponding changes in tail current of defined or nominal unit of tail current ($I_{Unit}$);

(c) Tuning code values 28-32 fall within a third nonlinear operating region 918, and incremental changes in tuning code 904 cause corresponding changes in tail current of $2/3\times I_{Unit}$;

Having applied the weights defined by the current source configuration table 830, the curve 906 exhibits improved linearity over the curves 726*a*, 726*b*, 726*c* illustrated in FIG. 7. Linearity may be further improved by increasing the number of defined operating regions and/or through the use of different or more granular weightings for current steps. The tuning code 904 may be implemented as a thermometer code that progressively activates one or more gating transistors 808*a*-808*h* in the tail current subcircuits for each increment of the thermometer code value. The phase shift in the output of the phase interpolator 800 is determined by the number of transistor pairs 804*a*-804*h* that receive tail currents and the relative amplitudes of the tail currents. In many instances, a pair of phase-adjacent gating transistors 808*a*/808*c*, 808*c*/808*c*, 808*c*/808*g*, 808*g*/808*b*, 808*b*/808*d*, 808*d*/808*f*, 808*f*/808*h* or 808*h*/808*a* is turned on in some tail current subcircuits and one gating transistor of the pair of phase-adjacent gating transistors 808*a*/808*c*, 808*c*/808*c*, 808*c*/808*g*, 808*g*/808*b*, 808*b*/808*d*, 808*d*/808*f*, 808*f*/808*h* or 808*h*/808*a* is turned on in other tail current subcircuits.

In some implementations, the phase interpolator 800 may be configured such that tail current subcircuits that include a turned-on pair of adjacent gating transistors are enabled by lower thermometer code values and tail current subcircuits that include a single turned-on gating transistor from the pair of adjacent gating transistors are enabled by higher thermometer code values. In the illustrated phase interpolator 800, the tail current subcircuit 802 provides an example in which eight pairs of adjacent gating transistors 808*a*/808*c*, 808*c*/808*c*, 808*c*/808*g*, 808*g*/808*b*, 808*b*/*d*, 808*d*/808*f*, 808*f*/808*h*, 808*h*/808*a* are defined, each of the constituent gating transistors being configurable to supply current to the eight transistor pairs 804*a*-804*h*, where the transistor pairs 804*a*-804*h* receive different phase shifted versions of an input signal that are separated by a minimum phase angle of 45°. The lower thermometer code values may be used to turn on an equal number of pairs of phase-adjacent gating transistors 808*a*/808*c*, 808*c*/808*c*, 808*c*/808*g*, 808*g*/808*b*, 808*b*/808*d*, 808*d*/808*f*, 808*f*/808*h* or 808*h*/808*a* and the current sources in the corresponding tail current subcircuits can be configured to provide a current that is provided in equal portions through the phase-adjacent gating transistors 808*a*/808*c*, 808*c*/808*c*, 808*c*/808*g*, 808*g*/808*b*, 808*b*/808*d*, 808*d*/808*f*, 808*f*/808*h* or 808*h*/808*a*. These equal portions may conform to the step increases associated with the thermometer code value, and the current produced by the current sources in the corresponding tail current subcircuits may be configured to deliver double the associated step increase. In these implementations, the current flowing through two of the transistor pairs 804*a*-804*h* is consistent with the scheme defined by the current source configuration table 830 regardless of differences in number of tail current subcircuits that provide tail current to each of the two transistor pairs 804*a*-804*h*.

In some implementations, the phase interpolator 800 may be configured such that a fixed number of gating transistors are enabled at any time. In the illustrated phase interpolator 800, for example, 32 gating transistors are enabled at any time, with some portion of the enabled gating transistors supplying tail current to one of the transistor pairs 804*a*-804*h* and the remaining enabled gating transistors supplying tail current to another transistor pair 804*a*-804*h*. Typically, the transistor pairs 804*a*-804*h* that are supplied tail current receive different phase shifted versions of an input signal that are separated by a minimum phase angle. In the illustrated phase interpolator 800, the minimum phase angle is 45° based on the use of eight transistor pairs 804*a*-804*h*. In these implementations, two different tail current subcircuits may supply the tail currents to the different transistor pairs 804*a*-804*h*. The amplitude of step increases in each of the tail currents supplied by the two different tail current subcircuits may be defined independently using the current source configuration table 830.

In some implementations, the phase interpolator 800 may be configured by some combination of control logic provided within a physical layer interface circuit and/or a processing circuit that includes combinational logic, finite state machines, microcontrollers, microprocessors and/or other processing devices. A physical layer interface circuit may provide the circuits used to interface a device to a communication link, and may include serializers, deserializers, and clock generation or processing circuits such as oscillators, phase-locked loops and the phase interpolator 800. The source configuration table 830 may be maintained in storage by a processing circuit. In one example, the processing circuit may establish or configure the source configuration table 830 during system initialization, calibration or during link training. Link training may be performed during calibration or at the commencement of certain transactions involving the communication link and may be used to establish relationships between data signals and the phase of clock signals used to sample the data signals. In one example, the phase interpolator 800 may be used to configure the phase of sampling clock signals with respect to data signals.

Figure 10:
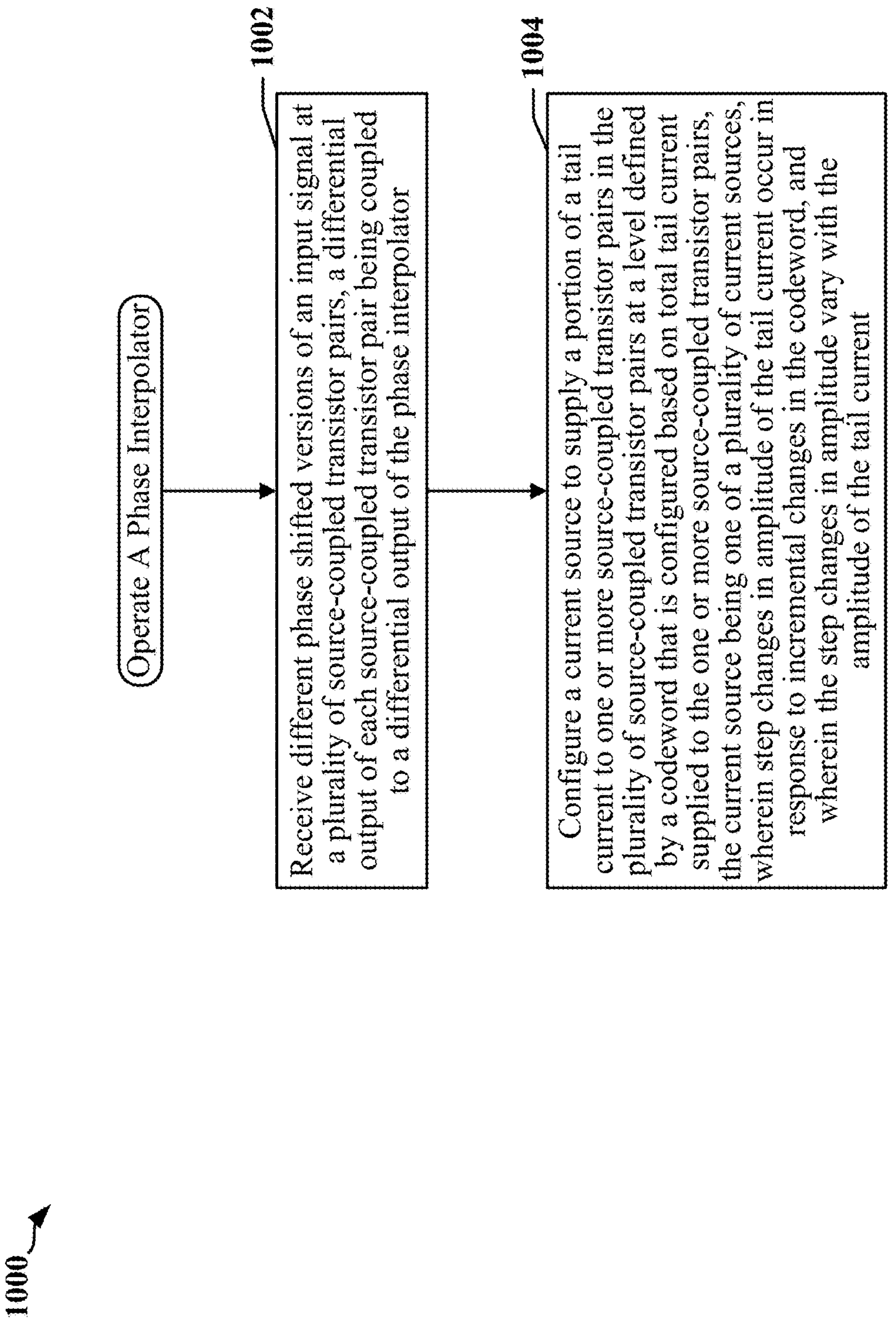
FIG. 10 is a flow diagram illustrating an example of a method for operating a phase interpolator in accordance with certain aspects of the present disclosure.

FIG. 10 is a flow diagram illustrating an example of a method 1000 for operating a phase interpolator in accordance with certain aspects of the present disclosure. The phase interpolator may be operable in a high-frequency interface. In one example, the operation of the phase interpolator can be linearized. Linearity can be improved for operating conditions that are subject to variation due to changes in process parameters, voltage and/or temperature. In some implementations, the high-frequency interface includes a serializer/deserializer. The method may be performed using some combination of control logic within the phase interpolator and/or a processing circuit that includes combinational logic, storage including storage configured to maintain a lookup table, finite state machines, microcontrollers, microprocessors and/or other processing devices. For example, the processing circuit may include one or more of the CPU 104, modem processor 106, graphics processor 108, and application processor 110 illustrated in FIG. 1.

At block 1002, different phase shifted versions of an input signal are received at a plurality of source-coupled transistor pairs. A differential output of each source-coupled transistor pair may be coupled to a differential output of the phase interpolator. At block 1004, a current source is configured to supply a portion of a tail current to one or more source-coupled transistor pairs in the plurality of source-coupled transistor pairs. The tail current may be supplied at a level defined by a codeword. The codeword may be generated or provided by the control logic within the phase interpolator and/or the processing circuit. The codeword may be configured based on total tail current supplied to the one or more source-coupled transistor pairs. The current source may be one of a plurality of current sources. Step changes in amplitude of the tail current may occur in response to incremental changes in the codeword. The step changes in amplitude may vary with the amplitude of the tail current. In one example, amplitude of the step changes may vary in accordance with the current source configuration table 830 illustrated in FIG. 8 or in accordance with a current source configuration table provided for the operating conditions expected for the phase interpolator.

In certain implementations, the amplitude of the tail current is the sum of currents supplied by a subset of the plurality of current sources that is enabled by the codeword. In one example, a value encoded in the codeword selects a subset of the plurality of current sources that is coupled to the one or more source-coupled transistor pairs in the plurality of source-coupled transistor pairs.

In certain implementations, the amplitude of step changes in the tail current corresponds to a unit current level when the value encoded in the codeword lies within a first range of values. Amplitude of step changes in the tail current may be decreased from the unit current level by a first fraction of the unit current level when the value encoded in the codeword lies within a second range of values. Amplitude of step changes in the tail current may be increased by a second fraction of the unit current level when the value encoded in the codeword lies within a third range of values. In one aspect, amplitude of step changes in the tail current is defined by a lookup table that is indexed by the codeword.

In certain implementations, the phase interpolator has a plurality of tail current subcircuits. Each tail current subcircuit may include one of the plurality of current sources and a plurality of switches. The current source in each tail current subcircuit may be coupled to the one or more source-coupled transistor pairs when enabled by the codeword.

In certain implementations, N different phase shifted versions of the input signal are separated by a minimum phase angle calculated as 360°/N. Two adjacent source-coupled transistor pairs may be supplied a portion of the tail current. The two adjacent source-coupled transistor pairs may receive phase shifted versions of the input signal that are separated by the minimum phase angle. In an example where the phase interpolator has eight source-coupled transistor pairs (N=8), eight different phase shifted versions of the input signal are separated by a minimum phase angle of 45° and the adjacent source-coupled transistor pairs may receive phase shifted versions of the input signal that are separated by 45°. The latter example may correspond in some respects to the operation of the phase interpolator 800 illustrated in FIG. 8.

The operational steps described in any of the exemplary aspects herein are described to provide a subset of examples of possible implementations. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

In one example, an apparatus includes means for driving a differential output of a phase interpolator and means for supplying a tail current to one or more source-coupled transistor pairs in the plurality of source-coupled transistor pairs. The means for driving the differential output of the phase interpolator may include a plurality of source-coupled transistor pairs configured to receive different phase shifted versions of an input signal. Each source-coupled transistor pair may be coupled to the differential output of a phase interpolator. The means for supplying the tail current to the one or more source-coupled transistor pairs in the plurality of source-coupled transistor pairs may include a plurality of current sources. Each current source may be configured to supply a portion of the tail current at a level defined by a codeword. The codeword may be configured based on total tail current supplied to the one or more source-coupled transistor pairs. Step changes in amplitude of the tail current may occur in response to incremental changes in the codeword. The step changes in amplitude may vary with the amplitude of the tail current.

In one implementation, a phase interpolator includes a plurality of source-coupled transistor pairs and a plurality of current sources. The plurality of source-coupled transistor pairs may be configured to receive different phase shifted versions of an input signal. A differential output of each source-coupled transistor pair may be coupled to a differential output of the phase interpolator. Each current source in the plurality of current sources may be configured to supply a portion of a tail current to one or more source-coupled transistor pairs in the plurality of source-coupled transistor pairs at a level defined by a codeword. Step changes in amplitude of the tail current may occur in response to incremental changes in the codeword. The step changes in amplitude may vary with the amplitude of the tail current.

In certain aspects, the amplitude of the tail current is the sum of currents supplied by a subset of the plurality of current sources that is enabled by the codeword. In one aspect, a value encoded in the codeword selects a subset of the plurality of current sources that is coupled to the one or more source-coupled transistor pairs in the plurality of source-coupled transistor pairs.

In certain aspects, amplitude of step changes in the tail current corresponds to a unit current level when the value encoded in the codeword lies within a first range of values. Amplitude of step changes in the tail current may be decreased from the unit current level by a first fraction of the unit current level when the value encoded in the codeword lies within a second range of values. Amplitude of step changes in the tail current may be increased by a second fraction of the unit current level when the value encoded in the codeword lies within a third range of values. In one aspect, amplitude of step changes in the tail current is defined by a lookup table that is indexed by the codeword.

In one aspect, the phase interpolator has a plurality of tail current subcircuits. Each tail current subcircuit may include one of the plurality of current sources and a plurality of switches. The current source in each tail current subcircuit may be coupled to the one or more source-coupled transistor pairs when enabled by the codeword.

In one aspect, N different phase shifted versions of the input signal are separated by a minimum phase angle calculated as 360°/N. Two adjacent source-coupled transistor pairs may be supplied a portion of the tail current. The two adjacent source-coupled transistor pairs may receive phase shifted versions of the input signal that are separated by the minimum phase angle. In an example where the phase interpolator has eight source-coupled transistor pairs (N=8), eight different phase shifted versions of the input signal are separated by a minimum phase angle of 45° and the adjacent source-coupled transistor pairs may receive phase shifted versions of the input signal that are separated by 45°.

Some implementation examples are described in the following numbered clauses:

1. A phase interpolator, comprising: a plurality of source-coupled transistor pairs configured to receive different phase shifted versions of an input signal, a differential output of each source-coupled transistor pair being coupled to a differential output of the phase interpolator; and a plurality of current sources, each current source being configured to supply a portion of a tail current to one or more source-coupled transistor pairs in the plurality of source-coupled transistor pairs at a level defined by a codeword, wherein step changes in amplitude of the tail current occur in response to incremental changes in the codeword, and wherein the step changes in amplitude vary with the amplitude of the tail current.
2. The phase interpolator as described in clause 1, wherein the amplitude of the tail current is the sum of currents supplied by a subset of the plurality of current sources that is enabled by the codeword.
3. The phase interpolator as described in clause 1 or clause 2, wherein a value encoded in the codeword selects a subset of the plurality of current sources that is coupled to the one or more source-coupled transistor pairs in the plurality of source-coupled transistor pairs.
4. The phase interpolator as described in any of clauses 1-3, wherein amplitude of step changes in the tail current corresponds to a unit current level when the value encoded in the codeword lies within a first range of values, is decreased by a first fraction of the unit current level when a value encoded in the codeword lies within a second range of values, and is increased by a second fraction of the unit current level when the value encoded in the codeword lies within a third range of values.
5. The phase interpolator as described in any of clauses 1-4, further comprising: a plurality of tail current subcircuits, each tail current subcircuit comprising one of the plurality of current sources and a plurality of switches, wherein the current source in each tail current subcircuit is coupled to the one or more source-coupled transistor pairs when enabled by the codeword.
6. The phase interpolator as described in any of clauses 1-5, wherein N different phase shifted versions of the input signal are separated by a minimum phase angle calculated as 360°/N, and wherein two adjacent source-coupled transistor pairs are supplied a portion of the tail current, the two adjacent source-coupled transistor pairs receiving phase shifted versions of the input signal that are separated by the minimum phase angle.
7. The phase interpolator as described in clause 6, wherein N=8 and the different phase shifted versions of the input signal are separated by a minimum phase angle of 45°.
8. An apparatus comprising: means for driving a differential output of a phase interpolator, including a plurality of source-coupled transistor pairs configured to receive different phase shifted versions of an input signal, each source-coupled transistor pair being coupled to the differential output of a phase interpolator; and means for supplying a tail current to one or more source-coupled transistor pairs in the plurality of source-coupled transistor pairs, including a plurality of current sources, each current source being configured to supply a portion of the tail current at a level defined by a codeword that is configured based on total tail current supplied to the one or more source-coupled transistor pairs, wherein step changes in amplitude of the tail current occur in response to incremental changes in the codeword, and wherein the step changes in amplitude vary with the amplitude of the tail current.
9. The apparatus as described in clause 8, wherein the amplitude of the tail current is the sum of currents supplied by a subset of the plurality of current sources that is enabled by the codeword, and wherein a value encoded in the codeword selects a subset of the plurality of current sources that is coupled to the one or more source-coupled transistor pairs in the plurality of source-coupled transistor pairs.
10. The apparatus as described in clause 8 or clause 9, wherein amplitude of step changes in the tail current corresponds to a unit current level when the value encoded in the codeword lies within a first range of values, is decreased by a first fraction of the unit current level when a value encoded in the codeword lies within a second range of values, and is increased by a second fraction of the unit current level when the value encoded in the codeword lies within a third range of values.
11. The apparatus as described in any of clauses 8-10, wherein each current source in the plurality of current sources is included in a tail current subcircuit that comprises switches that are configured to couple the plurality of source-coupled transistor pairs to an output of the each current source when enabled by the codeword.

12. The apparatus as described in any of clauses 8-11, wherein N different phase shifted versions of the input signal are separated by a minimum phase angle calculated as 360°/N, and wherein two adjacent source-coupled transistor pairs are supplied a portion of the tail current, the two adjacent source-coupled transistor pairs receiving phase shifted versions of the input signal that are separated by the minimum phase angle.

13. The apparatus as described in clause 12, wherein N=8 and the different phase shifted versions of the input signal are separated by a minimum phase angle of 45°.

14. A method for operating a phase interpolator, comprising: receiving different phase shifted versions of an input signal at a plurality of source-coupled transistor pairs, a differential output of each source-coupled transistor pair being coupled to a differential output of the phase interpolator; and configuring a current source to supply a portion of a tail current to one or more source-coupled transistor pairs in the plurality of source-coupled transistor pairs at a level defined by a codeword that is configured based on total tail current supplied to the one or more source-coupled transistor pairs, the current source being one of a plurality of current sources, wherein step changes in amplitude of the tail current occur in response to incremental changes in the codeword, and wherein the step changes in amplitude vary with the amplitude of the tail current.

15. The method as described in clause 14, wherein the amplitude of the tail current is the sum of currents supplied by a subset of the plurality of current sources that is enabled by the codeword.

16. The method as described in clause 14 or clause 15, wherein a value encoded in the codeword selects a subset of the plurality of current sources that is coupled to the one or more source-coupled transistor pairs in the plurality of source-coupled transistor pairs.

17. The method as described in any of clauses 14-16, wherein amplitude of step changes in the tail current corresponds to a unit current level when the value encoded in the codeword lies within a first range of values, is decreased by a first fraction of the unit current level when a value encoded in the codeword lies within a second range of values, and is increased by a second fraction of the unit current level when the value encoded in the codeword lies within a third range of values.

18. The method as described in any of clauses 14-17, wherein each current source in the plurality of current sources is included in a tail current subcircuit that comprises switches that are configured to couple the plurality of source-coupled transistor pairs to an output of the each current source when enabled by the codeword.

19. The method as described in any of clauses 14-18, wherein N different phase shifted versions of the input signal are separated by a minimum phase angle calculated as 360°/N, and wherein two adjacent source-coupled transistor pairs are supplied a portion of the tail current, the two adjacent source-coupled transistor pairs receiving phase shifted versions of the input signal that are separated by the minimum phase angle.

20. The method as described in clause 19, wherein N=8 and the different phase shifted versions of the input signal are separated by a minimum phase angle of 45°.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A phase interpolator, comprising:

a plurality of source-coupled transistor pairs configured to receive different phase shifted versions of an input signal, a differential output of each source-coupled transistor pair being coupled to a differential output of the phase interpolator; and a plurality of current sources, each current source being configured to supply a portion of a tail current to one or more source-coupled transistor pairs in the plurality of source-coupled transistor pairs at a level defined by a codeword, wherein step changes in amplitude of the tail current occur in response to incremental changes in the codeword, wherein the step changes in amplitude vary with the amplitude of the tail current, and wherein an amplitude of step changes in the tail current corresponds to a unit current level when a value encoded in the codeword lies within a first range of values, is decreased by a first fraction of the unit current level when the value encoded in the codeword lies within a second range of values, and is increased by a second fraction of the unit current level when the value encoded in the codeword lies within a third range of values.

2. The phase interpolator of claim 1, wherein the amplitude of the tail current is the sum of currents supplied by a subset of the plurality of current sources that is enabled by the codeword.

3. The phase interpolator of claim 1, wherein a value encoded in the codeword selects a subset of the plurality of current sources that is coupled to the one or more source-coupled transistor pairs in the plurality of source-coupled transistor pairs.

4. The phase interpolator of claim 1, further comprising:

a plurality of tail current subcircuits, each tail current subcircuit comprising one of the plurality of current sources and a plurality of switches, wherein the current source in each tail current subcircuit is coupled to the one or more source-coupled transistor pairs when enabled by the codeword.

5. The phase interpolator of claim 1, wherein N different phase shifted versions of the input signal are separated by a minimum phase angle calculated as 360°/N, and wherein two adjacent source-coupled transistor pairs are supplied a portion of the tail current, the two adjacent source-coupled transistor pairs receiving phase shifted versions of the input signal that are separated by the minimum phase angle.

6. The phase interpolator of claim 5, wherein N=8 and the different phase shifted versions of the input signal are separated by a minimum phase angle of 45°.

7. An apparatus comprising:

means for driving a differential output of a phase interpolator, including a plurality of source-coupled transistor pairs configured to receive different phase shifted versions of an input signal, each source-coupled transistor pair being coupled to the differential output of a phase interpolator; and means for supplying a tail current to one or more source-coupled transistor pairs in the plurality of source-coupled transistor pairs, including a plurality of current sources, each current source being configured to supply a portion of the tail current at a level defined by a codeword that is configured based on total tail current supplied to the one or more source-coupled transistor pairs, wherein step changes in amplitude of the tail current occur in response to incremental changes in the codeword, wherein the step changes in amplitude vary with the amplitude of the tail current, and wherein an amplitude of step changes in the tail current corresponds to a unit current level when a value encoded in the codeword lies within a first range of values, is decreased by a first fraction of the unit current level when the value encoded in the codeword lies within a second range of values, and is increased by a second fraction of the unit current level when the value encoded in the codeword lies within a third range of values.

8. The apparatus of claim 7, wherein the amplitude of the tail current is the sum of currents supplied by a subset of the plurality of current sources that is enabled by the codeword, and wherein a value encoded in the codeword selects a subset of the plurality of current sources that is coupled to the one or more source-coupled transistor pairs in the plurality of source-coupled transistor pairs.

9. The apparatus of claim 7, wherein each current source in the plurality of current sources is included in a tail current subcircuit that comprises switches that are configured to couple the plurality of source-coupled transistor pairs to an output of the each current source when enabled by the codeword.

10. The apparatus of claim 7, wherein N different phase shifted versions of the input signal are separated by a minimum phase angle calculated as 360°/N, and wherein two adjacent source-coupled transistor pairs are supplied a portion of the tail current, the two adjacent source-coupled transistor pairs receiving phase shifted versions of the input signal that are separated by the minimum phase angle.

11. The apparatus of claim 10, wherein N=8 and the different phase shifted versions of the input signal are separated by a minimum phase angle of 45°.

12. A method for operating a phase interpolator, comprising:

receiving different phase shifted versions of an input signal at a plurality of source-coupled transistor pairs, a differential output of each source-coupled transistor pair being coupled to a differential output of the phase interpolator; and configuring a current source to supply a portion of a tail current to one or more source-coupled transistor pairs in the plurality of source-coupled transistor pairs at a level defined by a codeword that is configured based on total tail current supplied to the one or more source-coupled transistor pairs, the current source being one of a plurality of current sources, wherein step changes in amplitude of the tail current occur in response to incremental changes in the codeword, and wherein the step changes in amplitude vary with the amplitude of the tail current, and wherein an amplitude of step changes in the tail current corresponds to a unit current level when a value encoded in the codeword lies within a first range of values, is decreased by a first fraction of the unit current level when the value encoded in the codeword lies within a second range of values, and is increased by a second fraction of the unit current level when the value encoded in the codeword lies within a third range of values.

13. The method of claim 12, wherein the amplitude of the tail current is the sum of currents supplied by a subset of the plurality of current sources that is enabled by the codeword.

14. The method of claim 12, wherein a value encoded in the codeword selects a subset of the plurality of current sources that is coupled to the one or more source-coupled transistor pairs in the plurality of source-coupled transistor pairs.

15. The method of claim 12, wherein each current source in the plurality of current sources is included in a tail current subcircuit that comprises switches that are configured to couple the plurality of source-coupled transistor pairs to an output of the each current source when enabled by the codeword.

16. The method of claim 12, wherein N different phase shifted versions of the input signal are separated by a minimum phase angle calculated as 360°/N, and wherein two adjacent source-coupled transistor pairs are supplied a portion of the tail current, the two adjacent source-coupled transistor pairs receiving phase shifted versions of the input signal that are separated by the minimum phase angle.

17. The method of claim 16, wherein N=8 and the different phase shifted versions of the input signal are separated by a minimum phase angle of 45°.

* * * * *